(12) United States Patent
Nomura

(10) Patent No.: US 9,985,139 B2
(45) Date of Patent: May 29, 2018

(54) HYDROGENATED P-CHANNEL METAL OXIDE SEMICONDUCTOR THIN FILM TRANSISTORS

(71) Applicant: QUALCOMM Incorporated, San Diego, CA (US)

(72) Inventor: Kenji Nomura, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 194 days.

(21) Appl. No.: 14/863,289

(22) Filed: Sep. 23, 2015

(65) Prior Publication Data

US 2016/0133751 A1 May 12, 2016

Related U.S. Application Data

(60) Provisional application No. 62/078,874, filed on Nov. 12, 2014, provisional application No. 62/130,426, filed on Mar. 9, 2015.

(51) Int. Cl.
*H01L 21/02* (2006.01)
*H01L 29/786* (2006.01)
(Continued)

(52) U.S. Cl.
CPC ....... *H01L 29/7869* (2013.01); *G09G 3/2096* (2013.01); *H01L 21/02664* (2013.01);
(Continued)

(58) Field of Classification Search
CPC .................................................. H01L 21/0292
(Continued)

(56) References Cited

U.S. PATENT DOCUMENTS

| 5,504,020 A | 4/1996 | Aomori et al. |
| 7,189,992 B2 | 3/2007 | Wager et al. |

(Continued)

FOREIGN PATENT DOCUMENTS

| JP | 2000277743 A | 10/2000 |
| JP | 2004241504 A | 8/2004 |

(Continued)

OTHER PUBLICATIONS

International Search Report and Written Opinion—PCT/US2015/051921—ISA/EPO—dated Dec. 11, 2015.

(Continued)

*Primary Examiner* — Chandra Chaudhari
(74) *Attorney, Agent, or Firm* — Weaver Austin Villeneuve & Sampson LLP—QUAL

(57) ABSTRACT

This disclosure provides p-type metal oxide semiconductor materials that display good thin film transistor (TFT) characteristics. Also provided are TFTs including channels that include p-type oxide semiconductors, and methods of fabrication. The p-type metal oxide films may be hydrogenated such that they have a hydrogen content of at least $10^{18}$ atoms/cm$^3$, and in some implementations, at least $10^{20}$ atoms/cm$^3$, or higher. Examples of hydrogenated p-type metal oxide films include hydrogenated tin (II)-based films and hydrogenated copper (I)-based films. The TFTs may be characterized by having one or more TFT characteristics such as high mobility, low subthreshold swing (s-value), and high on/off current ratio.

17 Claims, 18 Drawing Sheets

(51) Int. Cl.
*H01L 29/66* (2006.01)
*H01L 29/36* (2006.01)
*H01L 29/04* (2006.01)
*H01L 27/092* (2006.01)
*G09G 3/20* (2006.01)

(52) U.S. Cl.
CPC ............ *H01L 27/092* (2013.01); *H01L 29/04* (2013.01); *H01L 29/36* (2013.01); *H01L 29/66742* (2013.01); *H01L 29/66969* (2013.01); *H01L 29/78693* (2013.01)

(58) Field of Classification Search
USPC ....................................................... 438/722
See application file for complete search history.

(56) References Cited

U.S. PATENT DOCUMENTS

| | | | |
|---|---|---|---|
| 7,297,977 | B2 | 11/2007 | Hoffman et al. |
| 7,372,114 | B2 | 5/2008 | Sakama et al. |
| 7,436,044 | B2 * | 10/2008 | Khan .................... H01L 23/345 257/350 |
| 7,462,862 | B2 | 12/2008 | Hoffman et al. |
| 7,564,055 | B2 | 7/2009 | Hoffman |
| 7,838,348 | B2 | 11/2010 | Hoffman et al. |
| 8,653,516 | B1 | 2/2014 | Nelson et al. |
| 8,748,222 | B2 | 6/2014 | Shinn et al. |
| 8,890,150 | B2 | 11/2014 | Sasaki et al. |
| 9,647,135 | B2 | 5/2017 | Nomura |
| 9,685,542 | B2 | 6/2017 | Nomura et al. |
| 2005/0133917 | A1 | 6/2005 | Hoffman et al. |
| 2007/0069209 | A1 | 3/2007 | Jeong et al. |
| 2008/0090341 | A1 | 4/2008 | Tanaka et al. |
| 2008/0224133 | A1 | 9/2008 | Park et al. |
| 2010/0140609 | A1 | 6/2010 | Yano et al. |
| 2011/0089444 | A1 | 4/2011 | Yao et al. |
| 2011/0097492 | A1 | 4/2011 | Kerr et al. |
| 2011/0253997 | A1 | 10/2011 | Park et al. |
| 2011/0309356 | A1 | 12/2011 | Yabuta et al. |
| 2012/0282733 | A1 | 11/2012 | Lee et al. |
| 2013/0075740 | A1 | 3/2013 | Correia et al. |
| 2013/0217180 | A1 | 8/2013 | Facchetti et al. |
| 2013/0241881 | A1 | 9/2013 | Jeon et al. |
| 2013/0280859 | A1 | 10/2013 | Kim et al. |
| 2013/0292668 | A1 | 11/2013 | Oh et al. |
| 2014/0077206 | A1 | 3/2014 | Sunamura et al. |
| 2014/0159035 | A1 | 6/2014 | Park et al. |
| 2014/0183525 | A1 | 7/2014 | Kaneko et al. |
| 2014/0217396 | A1 | 8/2014 | Imamura et al. |
| 2014/0353648 | A1 | 12/2014 | Abe et al. |
| 2015/0162191 | A1 | 6/2015 | Saly et al. |
| 2016/0133751 | A1 | 5/2016 | Nomura |
| 2016/0190290 | A1 | 6/2016 | Nomura et al. |
| 2016/0218223 | A1 | 7/2016 | Nomura |

FOREIGN PATENT DOCUMENTS

| | | |
|---|---|---|
| JP | 2008281988 A | 11/2008 |
| JP | 2012089878 A | 5/2012 |
| JP | 2012151174 A | 8/2012 |
| KR | 20140095106 A | 7/2014 |
| WO | WO-2008126879 A1 | 10/2008 |
| WO | WO-2013081169 A1 | 6/2013 |

OTHER PUBLICATIONS

Song, et al., "Effect of Post-Degosition Treatment on Characteristics of P-channel SnO Thin-Film Transistors", International Journal of Digital Content Technology and its Applications (JDCTA), vol. 7, No. 12, Aug. 2013, 6 pages.
Bachmann J., et al., "Stoichiometry of Nickel Oxide Films Prepared by ALD," Chemical Vapor Deposition, 2011, vol. 17 (7-9), pp. 177-180.
Han J.H., et al., "Growth of p-Type Tin(II) Monoxide Thin Films by Atomic Layer Deposition from Bis(1-dimethylamino-2-methyl-2propoxy)tin and H2O," Chemistry of Materials, 2014, vol. 26 (21), pp. 6088-6091.
International Search Report and Written Opinion—PCT/US2015/064130—ISA/EPO—dated Mar. 2, 2016.
Jeffrey E., et al., "Atomic Layer Deposition of Tin Oxide Films using tetrakis(dimethylamino) tin," Journal of Vacuum Science and Technology: Part at AVS /AIP, Melville, NY, US, Jan. 29, 2008 (Jan. 29, 2008), vol. 26, No. 2, pp. 244-252, XP012113850, ISSN: 0734-2101, DOI: 10.1116/1.2835087.
Office Action dated Feb. 26, 2016, issued in U.S. Appl. No. 14/586,282.
Final Office Action dated Jul. 29, 2016, issued in U.S. Appl. No. 14/586,282.
Hsu P.C., et al., "Fabrication of p-Type SnO Thin-Film Transistors by Sputtering with Practical Metal Electrodes," Japanese Journal of Applied Physics, 2013, vol. 52, pp. 05DC07-1-05DC07-6.
Hsu P.C et al., "Sputtering Deposition of P-Type SnO Films with $SnO_2$ Target in Hydrogen-Containing Atmosphere," ACS Applied Materials & Interfaces, Jul. 13, 2014, 6 pages.
Oh S-I., et al., "Hydrogenated IGZO Thin-Film Transistors Using High-Pressure Hydrogen Annealing," IEEE Transactions on Electron Devices, vol. 60, No. 8, Aug. 2013, pp. 2537-2541.
Shin Y.H. et al., Hydrogenation and Annealing Effects in n-Type ZnO Bulk Samples, Journal of the Korean Physical Society, vol. 53, No. 5, Nov. 2008, pp. 2504-2507.
Park S., "Synthesis and Study of Oxides and Chalcogenides: Thin Films and Crystals," An Abstract of the Thesis of Sangmoon Park, Doctor of Philosophy in Chemistry, presented on Jul. 22, 2002, 223 pages.
Janotti A. "Defects and Doping in Oxides: What we Have Learned So Far," Materials UC Santa Barbara, Sold State Lighting and Energy Center, Feb. 23, 2010, 39 pages.
Varley A. et al., "Ambipolar Doping in SnO," Appl. Phys. Lett., 103, 2013, pp. 082118-1-082118-4.
Remashan K. et al., "Impact of Hydrogenation of ZnO TFTs by Plasma-Deposited Silicon Nitride Gate Dielectric," IEEE Transactions on Electron Devices, vol. 55, No. 10, Oct. 2008, pp. 2736-2743.
Remashan K., et al., "Performance Enhancement of Bottom-gate ZnO TFTs by Hydrogenation Using Silicon Nitride Gate Insulator," downloaded from internet Jan. 2015, 1 page, undated, downloaded at https://www.google.com/?gws_rd=ssl#q=Performance+Enhancement+of+Bottom-gate+ZnO+TFTs+by+Hydrogenation.
Jessen G., "Study on the Hydrogenated ZnO-based Thin Film Transistors," Final Report, School of Information and Communications, Gwangju Institute of Science and Technology, Apr. 30, 2011, pp. 1-16.
Miyase T., "Roles of Hydrogen in Amorphous Oxide Semiconductor In—Ga—Zn—O: Comparison of Conventional and Ultra-High-Vacuum Sputtering," ECS Journal of Solid State Science and Technology, 2014, vol. 3, Issue. 9, Q3085-Q3090, 9 pages.
Office Action dated Jun. 30, 2016, issued in U.S. Appl. No. 14/603,186.
Office Action dated Oct. 28, 2016, issued in U.S. Appl. No. 14/603,186.
Notice of Allowance dated Jan. 19, 2017, issued in U.S. Appl. No. 14/603,186.
Office Action dated Dec. 28, 2016, issued in U.S. Appl. No. 14/586,282.
Notice of Allowance dated Apr. 18, 2017, issued in U.S. Appl. No. 14/586,282.
International Preliminary Report on Patentability dated May 26, 2017.
International Search Report and Written Opinion—PCT/US2015/064131—ISA/EPO—Feb. 24, 2016 (146041WO).
International Preliminary Report on Patentability dated Aug. 3, 2017.
International Preliminary Report on Patentability dated Jul. 13, 2017.

(56) References Cited

OTHER PUBLICATIONS

Batzill, M., et al., "The Surface and Materials Science of Tin Oxide", Progress in Surface Science, Elsevier, vol. 79, Issues 2-4, 2005, pp. 47-154.

Elam, J. et al., "Atomic Layer Deposition of Tin Oxide Films Using Tetrakis(Dimethylamino) Tin," J. Vac. Sci. Technol. A 26(Mar. 26/Apr. 2008. pp. 244-252.

Selvaraj, S.K. "Growth Behavior and Properties of Atomic Layer Deposited Tin Oxide on Silicon From Novel Tin(II)Acetylacetonate Precursor and Ozone," J. Vac. Sci. Technol. A 32(1), Jan./Feb. 2014, pp. 01A112-1-01A112-6.

Lee, B.K., "Physical/Chemical Properties of Tin Oxide Then Film Transistors Prepared Using Plasma-Enhanced Atomic Layer Deposition," Material Research Bulletin, 47 (2012), pp. 3051-3055.

Kook L.B., et al., "Physical/chemical Properties of Tin Oxide Thin Film Transistors Prepared using Plasma-Enhanced Atomic Layer Deposition," Materials Research Bulletin, Apr. 26, 2012 (Apr. 26, 2012), vol. 47, No. 10, pp. 3052-3055, XP028937675, ISSN: 0025-5408, DOI: 10.1016/J.MATERRESBULL.2012.04.120 p. 3052.

Lee C-H., et al., "P-type Mn-doped SnO2 oxide Semiconductor materials prepared by a Sol-gel method", The Korean Ceramic Society, 2011, 1 page.

Lee H N., et al., "p-Channel Tin Monoxide Thin Film Transistor Fabricated by Vacuum Thermal Evaporation," Jpn. J. Appl. Phys., 49, Issue 2R., 2010, pp. 020202-1-020202-3.

Ozmen, B., "Solution Deposition and Characterization of the Thin Film Inorganic Materials", An Abstract of The Thesis, Bahar Ozmen for the degree of Master of Science in Chemistry presented on Jul. 16, 2007, 66 pages.

Sathees, K.S., et al., "Growth Behavior and Properties of Atomic Layer Deposited Tin Oxide on Silicon from Novel Tin(II)acetylacetonate Precursor and Ozone," Journal of Vacuum Science and Technology: Part A, AVS /AIP, Melville, NY, US, Dec. 4, 2013 (Dec. 4, 2013), vol. 32, No. 1, 01A112, pp. 1-6, XP012179046, ISSN: 0734-2101, DOI: 10.1116/1.4837915 [retrieved on Jan. 1, 1901].

Reiners, M., et al., "Growth and Crystallization of TiO2 Thin Films by Atomic Layer Deposition Using a Novel Amido Guanidinate Titanium Source and Tetrakis-dimethylamido-titanium," Chemistry of Materials, 2013, vol. 25 (15), pp. 2934-2943.

\* cited by examiner

HYDROGENATED P-CHANNEL METAL OXIDE SEMICONDUCTOR THIN FILM TRANSISTORS

CROSS-REFERENCE TO RELATED APPLICATIONS

This application claims priority to U.S. Provisional Patent Application No. 62/078,874, filed Nov. 12, 2014 and to U.S. Provisional Patent Application No. 62/130,426, filed Mar. 9, 2015. Both of these applications are incorporated by reference herein in their entireties.

TECHNICAL FIELD

This disclosure relates to thin film transistors and more particularly to p-channel metal oxide thin film transistors.

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). The term IMOD or interferometric light modulator refers to a device that selectively absorbs and/or reflects light using the principles of optical interference. In some implementations, an IMOD display element may include a pair of conductive plates, one or both of which may be transparent and/or reflective, wholly or in part, and capable of relative motion upon application of an appropriate electrical signal. For example, one plate may include a stationary layer deposited over, on or supported by a substrate and the other plate may include a reflective membrane separated from the stationary layer by an air gap. The position of one plate in relation to another can change the optical interference of light incident on the IMOD display element. IMOD-based display devices have a wide range of applications, and are anticipated to be used in improving existing products and creating new products, especially those with display capabilities.

Hardware and data processing apparatus may be associated with electromechanical systems. Such hardware and data processing apparatus may include thin film transistors (TFTs). A TFT is a field-effect transistor that includes thin films of metal and semiconductor layers.

SUMMARY

The systems, methods and devices of this disclosure each have several innovative aspects, no single one of which is solely responsible for the desirable attributes disclosed herein.

One innovative aspect of the subject matter described in this disclosure can be implemented in a method including providing a substrate, forming a p-type metal oxide semiconductor layer on the substrate, and annealing the p-type metal oxide semiconductor layer in a hydrogen ($H_2$)-containing atmosphere to form a hydrogenated p-type metal oxide semiconductor layer.

In some implementations, the hydrogenated p-type metal oxide semiconductor layer has a hydrogen concentration of at least $10^{18}$ atoms/cm$^3$. Examples of p-type metal oxide semiconductors include a Sn (II)-based oxide semiconductor layers and Cu (I)-based oxide semiconductor layers. In some implementations, the p-type metal oxide semiconductor may be one of doped or undoped $Cu_2O$, $CuO$, $SnO$, $NiO$, $PbO$, $Ag_2O$, $Mn_3O_4$, $ZnRh_2O_4$, $SrCu_2O_2$, $CuWO_4$, and Ln-Ru—O compounds where Ln is any lanthanide except cerium (Ce). In some implementations, the p-type metal oxide semiconductor is selected from p-type copper delafossites of the formula $CuMO_2$, where M is a metal. In some implementations, the p-type metal oxide semiconductor is an $ABO_2$ oxide characterized by a delafossite crystal structure.

Forming the hydrogenated p-type metal oxide semiconductor layer may include depositing the p-type metal oxide layer in a $H_2$-containing atmosphere. The method may further include forming a gate electrode and a gate dielectric, wherein the gate dielectric is between the p-type metal oxide semiconductor layer and the gate electrode.

Another innovative aspect of the subject matter described in this disclosure can be implemented in an apparatus including a thin film transistor (TFT). The TFT may include a source electrode; a drain electrode; and a semiconductor channel connecting the source electrode and the drain electrode, the semiconductor channel including a hydrogenated p-type metal oxide having a hydrogen concentration of at least $10^{18}$ atoms/cm$^3$. The TFT may be produced, for example, by annealing a p-type metal oxide in a $H_2$-containing atmosphere. According to various implementations, hydrogenated p-type metal oxide semiconductor may have a hydrogen concentration of at least $10^{19}$ atoms/cm$^3$, at least $10^{20}$ atoms/cm$^3$, or at least $10^{21}$ atoms/cm$^3$.

In some implementations, at least 95% of the semiconductor channel is the p-type metal oxide semiconductor. In some implementations, the p-type metal oxide semiconductor may be a Sn(II)-based oxide semiconductor layer or a Cu(I)-based oxide semiconductor layer. In some implementations, the p-type metal oxide semiconductor may be one of doped or undoped $Cu_2O$, $CuO$, $SnO$, $NiO$, $PbO$, $Ag_2O$, $Mn_3O_4$, $ZnRh_2O_4$, $SrCu_2O_2$, $CuWO_4$, and Ln-Ru—O compounds, where Ln is any lanthanide except cerium (Ce). In some implementations, the p-type metal oxide semiconductor is selected from p-type copper delafossites of the formula $CuMO_2$, where M is a metal, for example a Group IIIA or IIIB metal. In some implementations, the p-type metal oxide semiconductor is an $ABO_2$ oxide characterized by a delafossite crystal structure. The TFT may be characterized by two or more of the following: a saturation mobility of at least 1.0 cm$^2$/V·s, a s-value of less than 10 V/decade, and a current on/off ratio of at least $1\times10^4$. In some implementations, the TFT is part of a complementary metal-oxide-semiconductor (CMOS) TFT device.

The apparatus may further include a display; a processor that is configured to communicate with the display, the processor being configured to process image data; and a memory device that is configured to communicate with the processor. In some implementations, the apparatus may include a driver circuit configured to send at least one signal to the display; and a controller configured to send at least a portion of the image data to the driver circuit. The driver circuit can include the TFT.

Details of one or more implementations of the subject matter described in this disclosure are set forth in the accompanying drawings and the description below. Although the examples provided in this disclosure are primarily described in terms of EMS and MEMS-based displays the concepts provided herein may apply to other types of displays such as liquid crystal displays, organic light-emitting diode ("OLED") displays, and field emission displays. Other features, aspects, and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
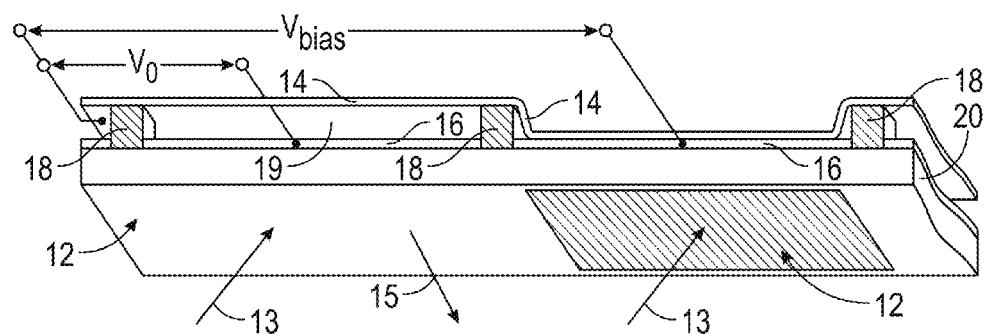
FIG. 1 is an isometric view illustration depicting two adjacent interferometric modulator (IMOD) display elements in a series or array of display elements of an IMOD display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Implementations described herein relate to p-type metal oxide films. The p-type metal oxide films may be hydrogenated such that they have a hydrogen content of at least $10^{18}$ atoms/cm$^3$, and in some implementations, at least $10^{19}$ atoms/cm$^3$, at least $10^{20}$ atoms/cm$^3$, or at least $10^{21}$ atoms/cm$^3$, or higher. Examples of hydrogenated p-type metal oxide films include hydrogenated tin (II)-based films and hydrogenated copper (I)-based films. Specific and further examples include doped or undoped copper (I) oxide ($Cu_2O$), copper (II) oxide (CuO), tin (II) oxide (SnO), nickel (II) oxide (NiO), lead (II) oxide (PbO), silver (I) oxide ($Ag_2O$); $ZnRh_2O_4$ (zinc rhodium oxide; ZRO) and p-type copper delafossites of the formula $CuMO_2$, where M is a metal, and well as compounds including one or more further metal cations to form ternary, quaternary, or higher order compounds.

Implementations described herein relate to p-type thin film transistors (TFTs) having p-type channels that include hydrogenated p-type metal oxide films. Compared to conventional TFTs, the TFTs disclosed herein have higher mobility, lower subthreshold swing (s-value), and/or higher on/off current ratio. In some implementations, p-type TFTs described herein may be used in complementary metal-oxide-semiconductor (CMOS) TFT devices, which include n-type TFTs and p-type TFTs.

Particular implementations of the subject matter described in this disclosure can be implemented to realize one or more of the following potential advantages. A hydrogenated p-type metal oxide semiconductor layer can be implemented in a p-type TFT to provide good TFT characteristics including high mobility, fast switching characteristics, and high on/off current ratios. A p-type TFT including a hydrogenated p-type metal oxide semiconductor may be implemented in a CMOS TFT circuit. Such TFT circuits may be integrated on a display backplate, for example as driver circuits, or in other electronic devices. This reduces manufacturing cost and failures associated with separately packaged integrated circuit (IC) drivers.

An example of a suitable EMS or MEMS device or apparatus, to which the described implementations of the TFT may apply, is a reflective display device. Reflective display devices can incorporate interferometric modulator (IMOD) display elements that can be implemented to selectively absorb and/or reflect light incident thereon using principles of optical interference. IMOD display elements can include a partial optical absorber, a reflector that is movable with respect to the absorber, and an optical resonant cavity defined between the absorber and the reflector. In some implementations, the reflector can be moved to two or more different positions, which can change the size of the optical resonant cavity and thereby affect the reflectance of the IMOD. The reflectance spectra of IMOD display elements can create fairly broad spectral bands that can be shifted across the visible wavelengths to generate different colors. The position of the spectral band can be adjusted by changing the thickness of the optical resonant cavity. One way of changing the optical resonant cavity is by changing the position of the reflector with respect to the absorber.

FIG. 1 is an isometric view illustration depicting two adjacent interferometric modulator (IMOD) display elements in a series or array of display elements of an IMOD display device. The IMOD display device includes one or more interferometric EMS, such as MEMS, display elements. In these devices, the interferometric MEMS display elements can be configured in either a bright or dark state. In the bright ("relaxed," "open" or "on," etc.) state, the display element reflects a large portion of incident visible light. Conversely, in the dark ("actuated," "closed" or "off," etc.) state, the display element reflects little incident visible light. MEMS display elements can be configured to reflect predominantly at particular wavelengths of light allowing for a color display in addition to black and white. In some implementations, by using multiple display elements, different intensities of color primaries and shades of gray can be achieved.

The IMOD display device can include an array of IMOD display elements which may be arranged in rows and columns. Each display element in the array can include at least a pair of reflective and semi-reflective layers, such as a movable reflective layer (i.e., a movable layer, also referred to as a mechanical layer) and a fixed partially reflective layer (i.e., a stationary layer), positioned at a variable and controllable distance from each other to form an air gap (also referred to as an optical gap, cavity or optical resonant cavity). The movable reflective layer may be moved between at least two positions. For example, in a first position, i.e., a relaxed position, the movable reflective layer can be positioned at a distance from the fixed partially reflective layer. In a second position, i.e., an actuated position, the movable reflective layer can be positioned more closely to the partially reflective layer. Incident light that reflects from the two layers can interfere constructively and/or destructively depending on the position of the movable reflective layer and the wavelength(s) of the incident light, producing either an overall reflective or non-reflective state for each display element. In some implementations, the display element may be in a reflective state when unactuated, reflecting light within the visible spectrum, and may be in a dark state when actuated, absorbing and/or destructively interfering light within the visible range. In some other implementations, however, an IMOD display element may be in a dark state when unactuated, and in a reflective state when actuated. In some implementations, the introduction of an applied voltage can drive the display elements to change states. In some other implementations, an applied charge can drive the display elements to change states.

The depicted portion of the array in FIG. 1 includes two adjacent interferometric MEMS display elements in the form of IMOD display elements 12. In the display element 12 on the right (as illustrated), the movable reflective layer 14 is illustrated in an actuated position near, adjacent or touching the optical stack 16. The voltage $V_{bias}$ applied across the display element 12 on the right is sufficient to move and also maintain the movable reflective layer 14 in the actuated position. In the display element 12 on the left (as illustrated), a movable reflective layer 14 is illustrated in a relaxed position at a distance (which may be predetermined based on design parameters) from an optical stack 16, which includes a partially reflective layer. The voltage $V_0$ applied across the display element 12 on the left is insufficient to cause actuation of the movable reflective layer 14 to an actuated position such as that of the display element 12 on the right.

In FIG. 1, the reflective properties of IMOD display elements 12 are generally illustrated with arrows indicating light 13 incident upon the IMOD display elements 12, and light 15 reflecting from the display element 12 on the left. Most of the light 13 incident upon the display elements 12 may be transmitted through the transparent substrate 20, toward the optical stack 16. A portion of the light incident upon the optical stack 16 may be transmitted through the partially reflective layer of the optical stack 16, and a portion will be reflected back through the transparent substrate 20. The portion of light 13 that is transmitted through the optical stack 16 may be reflected from the movable reflective layer 14, back toward (and through) the transparent substrate 20. Interference (constructive and/or destructive) between the light reflected from the partially reflective layer of the optical stack 16 and the light reflected from the movable reflective layer 14 will determine in part the intensity of wavelength(s) of light 15 reflected from the display element 12 on the viewing or substrate side of the device. In some implementations, the transparent substrate 20 can be a glass substrate (sometimes referred to as a glass plate or panel). The glass substrate may be or include, for example, a borosilicate glass, a soda lime glass, quartz, Pyrex, or other suitable glass material. In some implementations, the glass substrate may have a thickness of 0.3, 0.5 or 0.7 millimeters, although in some implementations the glass substrate can be thicker (such as tens of millimeters) or thinner (such as less than 0.3 millimeters). In some implementations, a non-glass substrate can be used, such as a polycarbonate, acrylic, polyethylene terephthalate (PET) or polyether ether ketone (PEEK) substrate. In such an implementation, the non-glass substrate will likely have a thickness of less than 0.7 millimeters, although the substrate may be thicker depending on the design considerations. In some implementations, a non-transparent substrate, such as a metal foil or stainless steel-based substrate can be used. For example, a reverse-IMOD-based display, which includes a fixed reflective layer and a movable layer which is partially transmissive and partially reflective, may be configured to be viewed from the opposite side of a substrate as the display elements 12 of FIG. 1 and may be supported by a non-transparent substrate.

The optical stack 16 can include a single layer or several layers. The layer(s) can include one or more of an electrode layer, a partially reflective and partially transmissive layer, and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals (e.g., chromium and/or molybdenum), semiconductors, and dielectrics. The partially reflective layer can be formed of one or more layers of materials, and each of the layers can be formed of a single material or a combination of materials. In some implementations, certain portions of the optical stack 16 can include a single semi-transparent thickness of metal or semiconductor which serves as both a partial optical absorber and electrical conductor, while different, electrically more conductive layers or portions (e.g., of the optical stack 16 or of other structures of the display element) can serve to bus signals between IMOD display elements. The optical stack 16 also can include one or more insulating or dielectric layers covering one or more conductive layers or an electrically conductive/partially absorptive layer.

In some implementations, at least some of the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material located between the posts 18. When the sacrificial material is etched away, a defined gap 19, or optical cavity, can be formed between the movable reflective layer 14 and the optical stack 16. In some implementations, the spacing between posts 18 may be approximately 1-1000 μm, while the gap 19 may be approximately less than 10,000 Angstroms (Å).

In some implementations, each IMOD display element, whether in the actuated or relaxed state, can be considered as a capacitor formed by the fixed and moving reflective layers. When no voltage is applied, the movable reflective layer 14 remains in a mechanically relaxed state, as illustrated by the display element 12 on the left in FIG. 1, with the gap 19 between the movable reflective layer 14 and optical stack 16. However, when a potential difference, i.e., a voltage, is applied to at least one of a selected row and column, the capacitor formed at the intersection of the row and column electrodes at the corresponding display element becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated display element 12 on the right in FIG. 1. The behavior can be the same regardless of the polarity of the applied potential difference. Though a series of display elements in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. In some implementations, the rows may be referred to as "common" lines and the columns may be referred to as "segment" lines, or vice versa. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
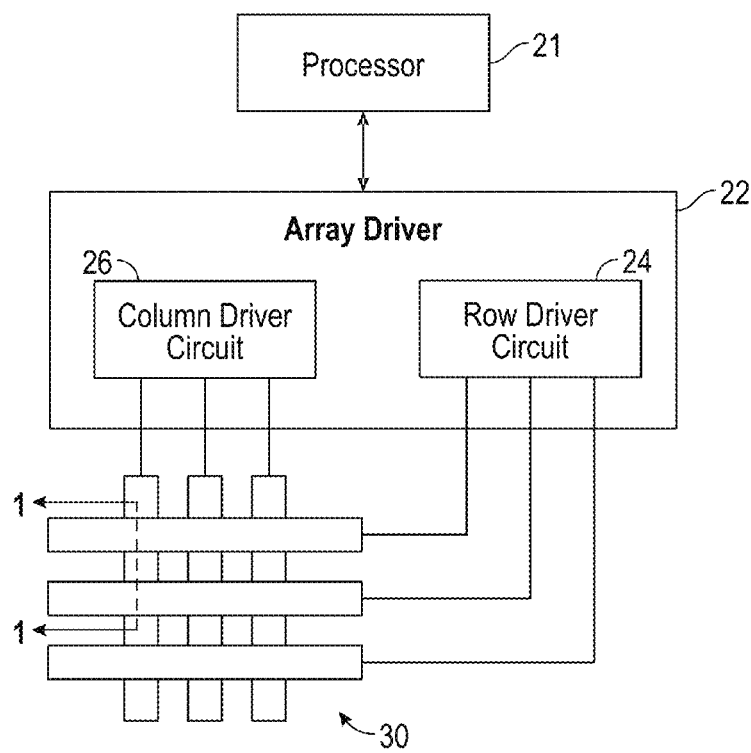
FIG. 2 is a system block diagram illustrating an electronic device incorporating an IMOD-based display including a three element by three element array of IMOD display elements.

FIG. 2 is a system block diagram illustrating an electronic device incorporating an IMOD-based display including a three element by three element array of IMOD display elements. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, for example a display array or panel 30. The cross section of the IMOD display device illustrated in FIG. 1 is shown by the lines 1-1 in FIG. 2. Although FIG. 2 illustrates a 3×3 array of IMOD display elements for the sake of clarity, the display array 30 may contain a very large number of IMOD display elements, and may have a different number of IMOD display elements in rows than in columns, and vice versa.

Figure 3A:
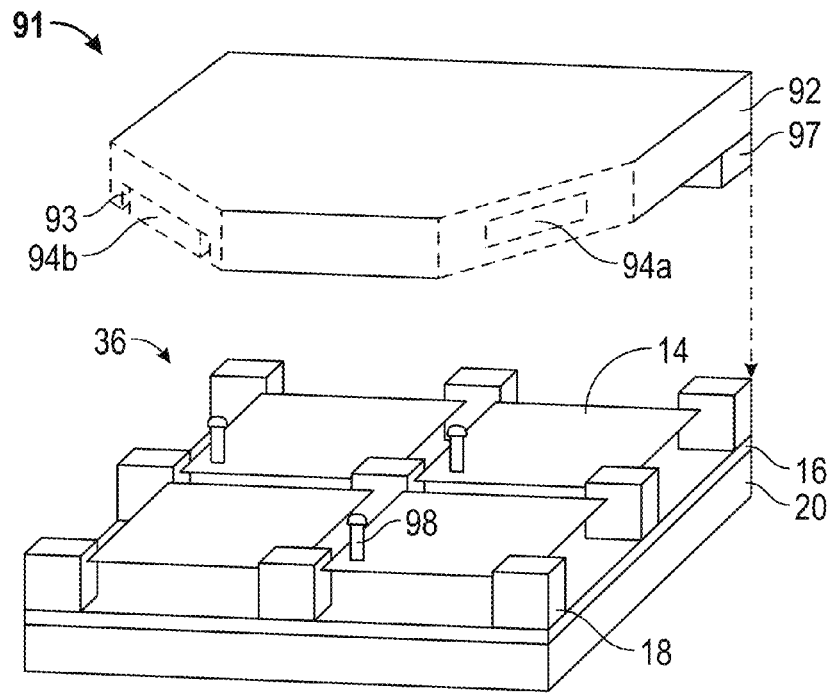
FIGS. 3A and 3B are schematic exploded partial perspective views of a portion of an electromechanical systems (EMS) package including an array of EMS elements and a backplate.
Figure 3B:
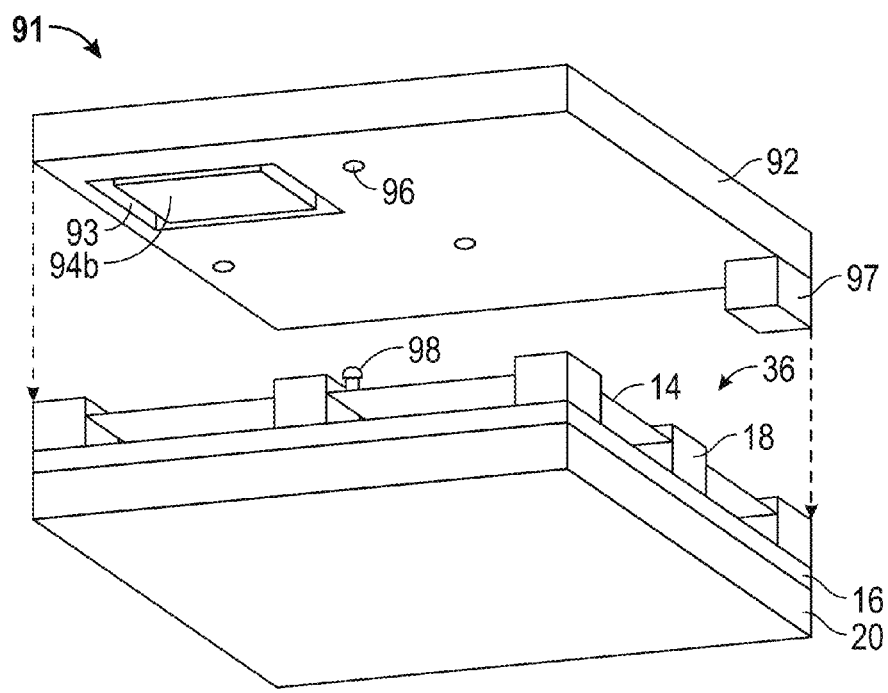

FIGS. 3A and 3B are schematic exploded partial perspective views of a portion of an EMS package 91 including an array 36 of EMS elements and a backplate 92. FIG. 3A is shown with two corners of the backplate 92 cut away to better illustrate certain portions of the backplate 92, while FIG. 3B is shown without the corners cut away. The EMS array 36 can include a substrate 20, support posts 18, and a movable layer 14. In some implementations, the EMS array 36 can include an array of IMOD display elements with one or more optical stack portions 16 on a transparent substrate, and the movable layer 14 can be implemented as a movable reflective layer.

The backplate 92 can be essentially planar or can have at least one contoured surface (e.g., the backplate 92 can be formed with recesses and/or protrusions). The backplate 92 may be made of any suitable material, whether transparent or opaque, conductive or insulating. Suitable materials for the backplate 92 include, but are not limited to, glass, plastic, ceramics, polymers, laminates, metals, metal foils, Kovar and plated Kovar.

As shown in FIGS. 3A and 3B, the backplate 92 can include one or more backplate components 94a and 94b, which can be partially or wholly embedded in the backplate 92. As can be seen in FIG. 3A, backplate component 94a is embedded in the backplate 92. As can be seen in FIGS. 3A and 3B, backplate component 94b is disposed within a recess 93 formed in a surface of the backplate 92. In some implementations, the backplate components 94a and/or 94b can protrude from a surface of the backplate 92. Although backplate component 94b is disposed on the side of the backplate 92 facing the substrate 20, in other implementations, the backplate components can be disposed on the opposite side of the backplate 92.

The backplate components 94a and/or 94b can include one or more active or passive electrical components, such as transistors, capacitors, inductors, resistors, diodes, switches, and/or integrated circuits (ICs) such as a packaged, standard or discrete IC. Other examples of backplate components that can be used in various implementations include antennas, batteries, and sensors such as electrical, touch, optical, or chemical sensors, or thin-film deposited devices.

In some implementations, the backplate components 94a and/or 94b can be in electrical communication with portions of the EMS array 36. Conductive structures such as traces, bumps, posts, or vias may be formed on one or both of the backplate 92 or the substrate 20 and may contact one another or other conductive components to form electrical connections between the EMS array 36 and the backplate components 94a and/or 94b. For example, FIG. 3B includes one or more conductive vias 96 on the backplate 92 which can be aligned with electrical contacts 98 extending upward from the movable layers 14 within the EMS array 36. In some implementations, the backplate 92 also can include one or more insulating layers that electrically insulate the backplate components 94a and/or 94b from other components of the EMS array 36. In some implementations in which the backplate 92 is formed from vapor-permeable materials, an interior surface of backplate 92 can be coated with a vapor barrier (not shown).

The backplate components 94a and 94b can include one or more desiccants which act to absorb any moisture that may enter the EMS package 91. In some implementations, a desiccant (or other moisture absorbing materials, such as a getter) may be provided separately from any other backplate components, for example as a sheet that is mounted to the backplate 92 (or in a recess formed therein) with adhesive. Alternatively, the desiccant may be integrated into the backplate 92. In some other implementations, the desiccant may be applied directly or indirectly over other backplate components, for example by spray-coating, screen printing, or any other suitable method.

In some implementations, the EMS array 36 and/or the backplate 92 can include mechanical standoffs 97 to maintain a distance between the backplate components and the display elements and thereby prevent mechanical interference between those components. In the implementation illustrated in FIGS. 3A and 3B, the mechanical standoffs 97 are formed as posts protruding from the backplate 92 in alignment with the support posts 18 of the EMS array 36. Alternatively or in addition, mechanical standoffs, such as rails or posts, can be provided along the edges of the EMS package 91.

Although not illustrated in FIGS. 3A and 3B, a seal can be provided which partially or completely encircles the EMS array 36. Together with the backplate 92 and the substrate 20, the seal can form a protective cavity enclosing the EMS array 36. The seal may be a semi-hermetic seal, such as a conventional epoxy-based adhesive. In some other implementations, the seal may be a hermetic seal, such as a thin film metal weld or a glass frit. In some other implementations, the seal may include polyisobutylene (PIB), polyurethane, liquid spin-on glass, solder, polymers, plastics, or other materials. In some implementations, a reinforced sealant can be used to form mechanical standoffs.

In alternate implementations, a seal ring may include an extension of either one or both of the backplate 92 or the substrate 20. For example, the seal ring may include a mechanical extension (not shown) of the backplate 92. In some implementations, the seal ring may include a separate member, such as an O-ring or other annular member.

In some implementations, the EMS array 36 and the backplate 92 are separately formed before being attached or coupled together. For example, the edge of the substrate 20 can be attached and sealed to the edge of the backplate 92 as discussed above. Alternatively, the EMS array 36 and the backplate 92 can be formed and joined together as the EMS package 91. In some other implementations, the EMS package 91 can be fabricated in any other suitable manner, such as by forming components of the backplate 92 over the EMS array 36 by deposition.

Hardware and data processing apparatus may be associated with EMS structures. Such hardware and data processing apparatus may include a transistor switch, such as a thin film transistor (TFT). EMS display elements in a display device may be arranged in an array such as a two-dimensional grid and addressed by circuits associated with the rows and columns of the array. Row driver circuits may drive the gates of transistor switches that select a particular row to be addressed, and common driver circuits may provide a bias to a given row of display elements that may be synchronously updated with a row refresh.

A display device can include an array of display elements, which can be referred to as pixels. Some displays can include hundreds, thousands, or millions of pixels arranged in hundreds or thousands of rows and hundreds and thousands of columns. Each pixel can be driven by one or more TFTs. A TFT is a type of field-effect transistor made by depositing thin films of a semiconductor layer as well as one or more dielectric layers and conductive layers over a substrate. With increasing developments in flat panel displays, systems-on-glass, display devices, mobile devices, wearable devices, and the like, there is a growing demand for high performance TFTs.

Integrating switching matrices with driver circuits on a display backplate, as well as in other electronic devices, reduces manufacturing cost and failures associated with separately packaged IC drivers. Complementary metal-oxide-semiconductor (CMOS) circuits use n-type and p-type channels. Disclosed herein are p-type metal oxide semiconductor materials that exhibit good TFT performance, as well as TFTs including p-type metal oxide semiconductor channels. Also disclosed are circuits including n-type and p-type TFTs as well as electronic devices, such as display devices, that include such circuits. While the below description focuses on p-type metal oxide semiconductors in the context of TFTs, the p-type metal oxide semiconductors may also be employed in other contexts, such as in solar applications.

Figure 4A:
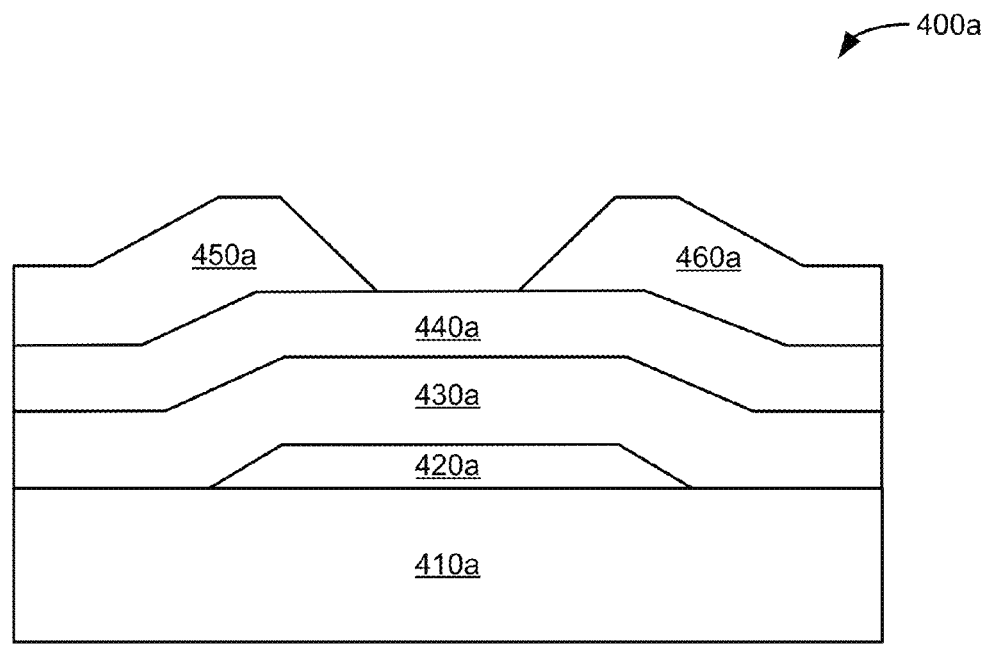
FIG. 4A is an example of a cross-sectional diagram illustrating a bottom gate thin film transistor (TFT) according to some implementations.

Generally, a TFT can include a semiconductor layer with a source region, a drain region, and a channel region in the semiconductor layer. As such, a TFT can be a three-terminal device that includes a source terminal, a drain terminal, and a gate terminal for modulating the conductivity of a channel. Some types of TFTs can be defined in terms of the location of the gate terminal. For example, types of TFT geometries can include a bottom gate geometry and a top gate geometry. FIG. 4A is an example of a cross-sectional diagram illustrating a bottom gate TFT according to some implementations. In FIG. 4A, a bottom gate TFT 400a includes a substrate 410a, a gate electrode 420a over the substrate 410a, a gate dielectric 430a over the gate electrode 420a, a semiconductor layer 440a over the gate dielectric 430a, a source electrode 450a over a source region of the semiconductor layer 440a, and a drain electrode 460a over a drain region of the semiconductor layer 440a, where a channel region in the semiconductor layer 440a is between the source region and the drain region. The semiconductor layer 440a electrically connects the source electrode 450a and the drain electrode 460a, with conductivity in the channel region a function of the potential applied across the gate electrode 420a and the source electrode 450a.

Figure 4B:
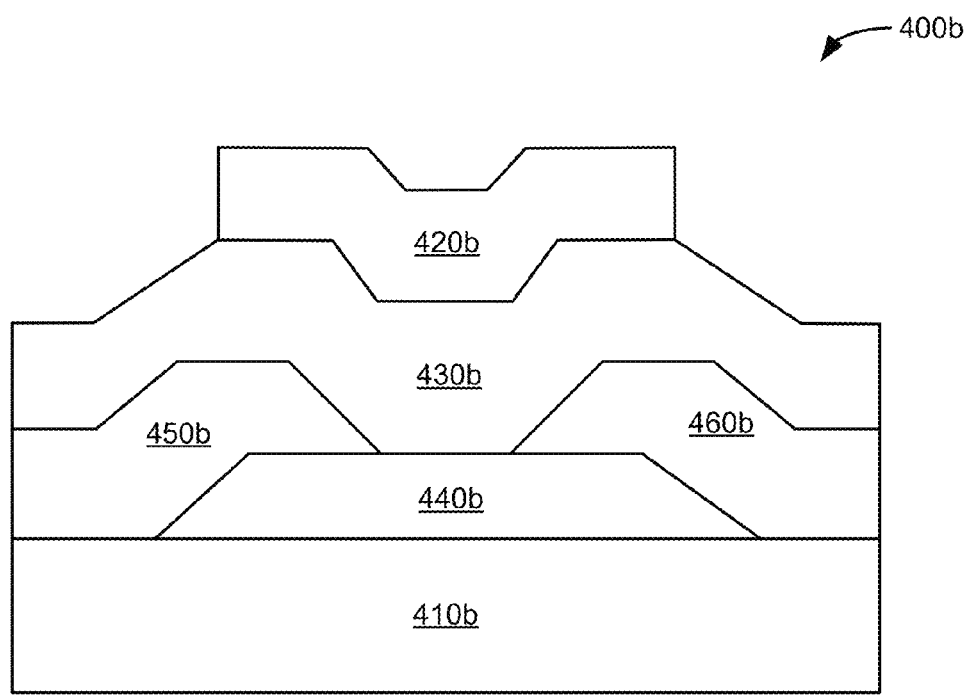
FIG. 4B is an example of a cross-sectional diagram illustrating a top gate TFT according to some implementations.

FIG. 4B is an example of a cross-sectional diagram illustrating a top gate TFT according to some implementations. In FIG. 4B, a top gate TFT 400b includes a substrate 410b, a semiconductor layer 440b over the substrate 410b, a source electrode 450b over a source region of the semiconductor layer 440b, a drain electrode 460b over a drain region of the semiconductor layer 440b, a gate dielectric 430b over the source electrode 450b, and a gate electrode 420b over the gate dielectric 430b, where a channel region is between the source region and the drain region of the semiconductor layer 440b. The semiconductor layer 440b electrically connects the source electrode 450b and the drain electrode 460b, with conductivity in the channel a function of the potential applied across the gate electrode 420b and the source electrode 450b.

The gate electrodes 420a and 420b may include one or more metals or other conductive materials. Examples of metals include aluminum (Al), copper (Cu), molybdenum (Mo), tantalum (Ta), chromium (Cr), neodymium (Nd), tungsten (W), titanium (Ti), gold (Au), nickel (Ni), and alloys containing any of these elements. In some implementations, each of the gate electrodes 420a and 420b can include two or more layers of different metals arranged in a stacked structure. In some implementations, each of the gate electrodes 420 can have a thickness between about 50 nm and about 500 nm, or between about 100 nm and about 250 nm.

The source electrodes 450a and 450b and the drain electrodes 460a and 460b may include any number of different metals or other conductive materials. Examples of metals include Mo, W, Au, Pt, Ag, Mg, Mn, Ti, Al, Cu, Ta, Cr, Nd, Ni, Sn and alloys containing any of these elements. For example, the source electrodes 450a and 450b and the drain electrodes 460a and 460b may include a stable contact metal such as Mo, W, Au, Pt, and Ag. In some implementations, each of the source electrodes 450a and 450b and the drain electrodes 460a and 460b includes two or more sub-layers of different metals arranged in a stacked structure. In some implementations, each of the source electrodes 450a and 450b and the drain electrodes 460a and 460b can have a thickness between about 50 nm and about 500 nm, or between about 100 nm and about 250 nm.

The gate dielectrics 430a and 430b may also be referred to as gate insulators. Each of the gate dielectrics 430a and 430b may include any number of different dielectric materials, including silicon dioxide ($SiO_2$), aluminum oxide ($Al_2O_3$), hafnium oxide ($HfO_2$), yttrium oxide ($Y_2O_3$), titanium oxide ($TiO_2$), silicon oxynitride (SiON), silicon nitride (SiN), or organic dielectric materials. In some implementations, each of the gate dielectrics 430a and 430b can include two or more layers of dielectric materials arranged in a stacked structure. In some implementations, a thickness of a gate dielectric layer can be between about 50 nm and about 500 nm, or between about 100 nm and about 250 nm.

In FIGS. 4A and 4B, the bottom gate TFT 400a and the top gate TFT 400b can include metal oxide TFTs, where the semiconductor layers 440a and 440b can include a metal oxide. In a metal oxide TFTs, metal oxide semiconductor is deposited as an active channel layer in the TFT. A metal oxide TFT can have high mobility. According to various implementations, the metal oxide TFT is a p-type metal oxide TFT, where the semiconductor layers 440a and 440b can include a p-type metal oxide.

Most oxide semiconductors are n-type semiconductors, with few materials exhibiting p-type conduction. The p-type oxide semiconductors that are known are generally not suited for TFTs due to their high defect densities. The ability to form p-type, as well as n-type, oxide semiconductors TFTs allows CMOS TFT circuits to be made, for example. According to various implementations, the p-type oxide semiconductors disclosed herein are hydrogenated. These hydrogenated p-type oxide semiconductors have significantly improved TFT characteristics. High density defects have prevented p-type oxide semiconductors from employment in TFTs. These defect densities result in lack of field-effect current modulation in the p-type oxide semiconductors.

One type of defects in the p-type materials disclosed herein are vacancy-type defects. This is unlike, for example, silicon semiconductors, which have dangling bonds. As such, hydrogenation of the p-type materials disclosed herein results in different mechanisms and effects than hydrogenation of other semiconductor materials. For instance, hydrogenation of covalent semiconductors may be employed to terminate dangling bonds. In amorphous silicon (a-Si), for example, a non-bonding state of a dangling bond may be located near the middle of the bandgap, trapping both an electron and a hole, and deteriorating TFT performance. A hydrogenation termination process can terminate dangling bond defects to create a-Si:H, passivating these dangling bond defects.

With oxide semiconductors, however, which are ionic rather than covalent in nature, vacancy defects, rather than dangling bond defects, dominate. Hydrogenation of n-type oxide semiconductors (e.g., ZnO or IGZO) has been used as hydrogen in ZnO semiconductors is a known as a shallow donor. However, hydrogen impurities in n-type oxide semiconductors make excess electrons and result in large degradation of TFT performance. As such, the amount of hydrogen introduced to an n-type oxide semiconductor is typically reduced or controlled to a certain level.

Hydrogenation of the p-type materials disclosed herein, by contrast, results in significantly improved TFT characteristics. Without being bound by a particular theory, it is believed that hydrogen terminates vacancy defects. For example, in a tin (II) oxide (SnO) material, hydrogenation terminates Sn vacancies ($V_{Sn}$) and O vacancies ($V_o$) by H+ and/or H−.

Implementations described herein relate to p-type oxide semiconductor materials that display good TFT characteristics, as well as TFTs including channels having the p-type oxide semiconductors, and methods of fabrication.

The metal oxide semiconductors disclosed herein include any hydrogenated metal oxide semiconductor that exhibits p-type conductivity. As noted above, most metal oxide semiconductors exhibit n-type behavior. However, various materials have been found to exhibit p-type conductivity. In general, the p-type metal oxide semiconductors described herein exhibit p-type conductivity in their undoped states (rather than, for example, acceptor-doped ZnO), and may include binary (one metal cation) and ternary or higher order (two or more metal cations) compounds.

Examples of metal oxide semiconductors that have been shown to exhibit p-type conductivity include copper (I) oxide (also known as cuprous oxide; $Cu_2O$), copper (II) oxide (also known as cupric oxide; CuO), tin (II) oxide (also known as stannous oxide or tin monoxide; SnO), lead (II) oxide (also known as lead monoxide; PbO), nickel (II) oxide (also known as nickel monoxide; NiO), silver (I) oxide (also known as silver monoxide; $Ag_2O$), and p-type copper delafossites of the formula $CuMO_2$, where M is a metal. In some implementations, M is a Group IIIA or IIIB metal. Examples of p-type Cu(I) based delafossites include $CuAlO_2$, $CuGaO_2$, $CuInO_2$, $CuScO_2$, $CuYO_2$, $CuLaO_2$ and $CuBO_2$. Various other ternary and quaternary copper-containing oxides have been reported as exhibiting p-type conductivity including $SrCu_2O_2$, $CuWO_4$, $CuCrO_2$, and $CuFeO_2$. Calcium-doped compounds $CuCa_{0.05}Y_{0.95}O_2$ and $CuCa_{0.05}Cr_{0.05}O_2$ also exhibit p-type conductivity. Tin-containing oxides including $SnWO_4$, $Sn_2TiO_4$, $Sn_2Nb_2O_7$ also exhibit p-type conductivity. Other p-type oxide semiconductors include $Cr_2O_3$, $Co_3O_4$, $Mn_3O_4$, Ln-Ru—O compounds where Ln is lanthanide except cerium (Ce), and $ZnRh_2O_4$ (zinc rhodium oxide; ZRO). Mn-containing oxides including $Cr_2MnO_4$ and $Mn_2SnO_4$ are also p-type oxide semiconductor.

It should be noted that in certain references, there is a tendency to refer to a metal oxide omitting the ratios of the constituent ions. For example, indium gallium zinc oxide (IGZO) films are commonly referred to as $InGaZnO_4$, though the ratio of ions may not be 1:1:1:4. Similarly, tin (IV) oxide ($SnO_2$) may be referred to as SnO in this shorthand manner. As used herein, however, SnO refers to stannous oxide (also known as tin monoxide; or tin (II) oxide). This is a distinct compound from tin (IV) oxide.

The p-type channels disclosed herein are not limited to the above examples of p-type oxide materials, but may include any hydrogenated p-type metal oxide channels. These include oxides having the formula $ABO_2$ that exhibit p-type conduction. In some implementations, the $ABO_2$ oxides are characterized by delafossite crystal structures. Delafossite crystal structures include planar layers of linear coordinated metal cations (A) between edge-shared O—B octahedral layers. Amorphous films that exhibit p-type conductivity of these $ABO_2$ compounds may also be employed. The p-type oxides disclosed herein may be doped or undoped with non-hydrogen dopants.

According to various implementations, the hydrogenated p-type oxide semiconductors disclosed herein may be amorphous (e.g., amorphous SnO or ZRO) or crystalline (e.g., crystalline $CuAlO_2$), including single crystalline and polycrystalline materials. In some implementations, polycrystalline materials may exhibit nanocrystallinity.

Many p-type semiconducting oxides are of interest as transparent conducting oxides (TCOs). However, while these materials may be useful as transparent conducting oxides, they typically are not of high enough quality for TFTs. This is due to the existence of excess carrier and the presence of defects in the bandgap. While such defects may not affect TCOs that exhibit metal-like conductivity in the conduction band, they greatly compromise TFT performance.

While defects in amorphous materials are harder to characterize than in crystalline materials, where any deviation from the crystalline structure is a defect, deviations from the coordination or stoichiometry of an amorphous material are defects. For example, amorphous tin monoxide (SnO) may have many metal or oxygen vacancies such that it is non-stoichiometric $Sn_{1-x}O$ or $SnO_{1-x}$. Defects in an ionic oxide can include metal cation vacancies ($V_M$), oxygen anion vacancies ($V_O$), oxygen anion interstitials ($O_i$), metal cation interstitials ($M_i$), as well as foreign cations, ions with zero effective charge, and charged vacancies. Without being bound by a particular theory, it is believed that the poor TFT performance of p-type metal oxides is due to a high density of metal cation vacancies. This is in contrast to n-type materials such as zinc oxide (ZnO) or indium gallium zinc oxide (IGZO), where oxygen vacancies dominate.

The p-type oxide semiconductors disclosed herein have hydrogen concentrations of at least $10^{18}$ atoms/cm$^3$, and in some implementations, at least $10^{21}$ atoms/cm$^3$. For example, the p-type oxide semiconductors disclosed herein may have hydrogen concentrations of least $10^{18}$ atoms/cm$^3$, at least $5^{19}$ atoms/cm$^3$, $10^{19}$ atoms/cm$^3$, $5^{19}$ atoms/cm$^3$, $10^{19}$ atoms/cm$^3$, $5^{20}$ atoms/cm$^3$, $10^{20}$ atoms/cm$^3$, $5^{21}$ atoms/cm$^3$, or $10^{21}$ atoms/cm$^3$ according to various implementations. The hydrogen concentration may alternatively be characterized by atomic percentage, with the atomic percentage of hydrogen being at least 0.01%, at least 0.05%, at least 0.1%, at least 0.5%, at least 1%, and at least 1.5% in some implementations.

One method of detecting hydrogen concentration is by hydrogen forward scattering spectrometry (HFS). A solid state detector may be used in HFS or another appropriate spectroscopic method to determine the hydrogen concentration in atoms/cm$^3$. An atomic percentage may be estimated using an atomic density of $5 \times 10^{22}$ atoms/cm$^3$. Atomic percentage may be determined from a concentration using an atomic density of approximately $5 \times 10^{22}$ atoms/cm$^3$. For example, $10^{18}$ atoms/cm$^3$ is approximately 0.01% atomic.

The hydrogen is ionically bonded to another constituent in the p-type oxide. In some implementations, most of the incorporated hydrogen terminates metal vacancies. It should be noted that the terms atoms/cm$^3$ and atomic percentage refers to hydrogen ionically bonded to another constituent of the metal oxide semiconductor, e.g., oxygen.

In some implementations, the semiconductor channels disclosed herein are essentially pure films of the hydrogenated p-type material, rather than mixtures of multiple forms of the oxide and/or a metallic element. For example, while SnO is a p-type material, $SnO_2$ is an n-type material.

Substantially no (less than 5%) or no tin (IV) oxide or metallic tin (Sn) may be present in the hydrogenated p-type material or TFT channel. In some implementations, the purity may be 95% or higher, such as 99%.

In some implementations, TFTs including hydrogenated p-type oxide channels are provided. The TFTs may be characterized by one or more of carrier mobility ($\mu$), threshold voltage ($V_{th}$), on/off current ratio ($I_{ON}/I_{OFF}$), subthreshold slope, and s-value.

Mobility characterizes how a carrier (hole or electron) moves through a semiconductor in the presence of an electric field, and is defined as $\mu = v_d/E$, where $v_d$ is the drift velocity of the electrons and E is the electric field.

Mobility may be determined by Hall effect measurements (and reported as Hall mobility) or extracted from TFT performance measurements (and reported as field effect mobility). For example, the carrier mobility may be extracted from experimental measurements of the drain current ($I_d$) and gate bias ($V_g$). Field effect mobility can be determined from saturation-mode or linear-region measurements. A TFT may also be characterized by threshold voltage ($V_{th}$), the minimum gate-to-source voltage differential that creates a conducting path between the source and drain, and on/off current ratio. Furthermore, high on/off current ratios are desirable. The TFT may be characterized by the subthreshold slope, which is a measure of the switching behavior of the TFT; a steep subthreshold slope indicates fast on/off transitions. Subthreshold swing (s-value) may also characterize the switching behavior, with a smaller s-value indicating faster on/off transitions.

A TFT having a hydrogenated p-type oxide channel may have one or more of a higher mobility, smaller s-value, and higher on/off ratio than a TFT having a non-hydrogenated channel of the same p-type material. For example, a TFT having a hydrogenated tin (II)-based channel may be characterized as having one or more of the following: a saturation field effect mobility of at least 1.0 cm$^2$/V·s, a s-value of less than 10 V/decade, and a current on/off ratio of at least $1 \times 10^4$. In some implementations, the TFT may have two or more of the indicated parameters. In some implementations, the saturation field effect mobility may be at least 1.5 cm$^2$/V·s. In some implementations, the s-value may be less than 6 V/decade. In some implementations, the current on/off ratio may be at least $5 \times 10^4$.

In another example, a TFT having a hydrogenated Cu(I)-based channel may be characterized as having one or more of the following: a saturation field effect mobility of at least 5 cm$^2$/V·s, a s-value of less than 10 V/decade, and a current on/off ratio of at least $10^4$.

Figure 5:
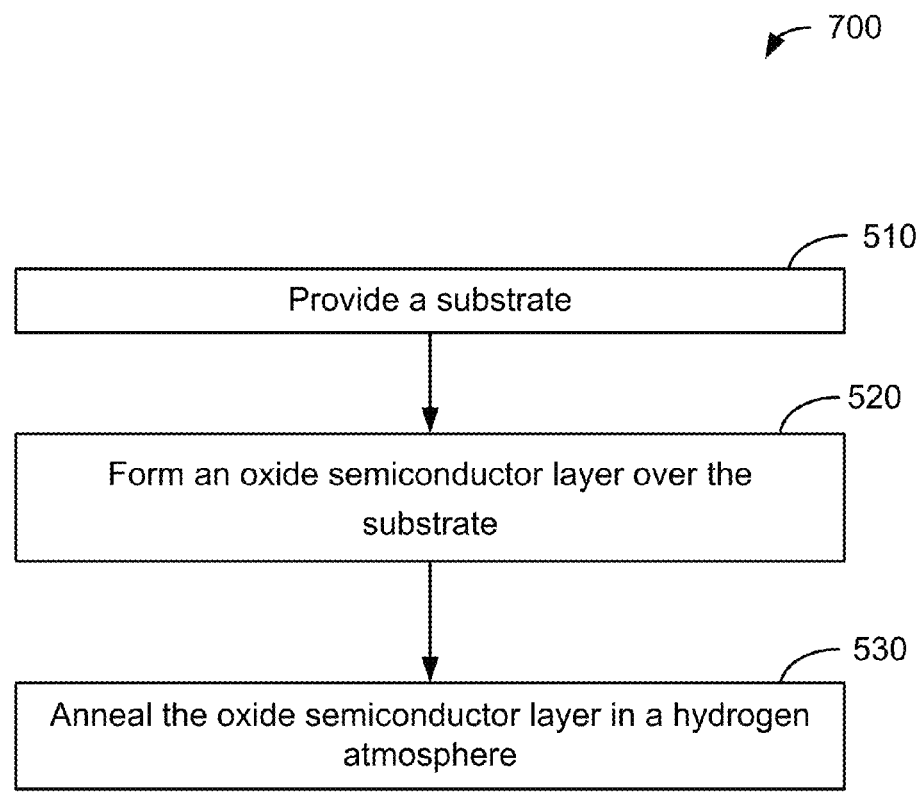
FIG. 5 is a flow diagram illustrating an example of a method of fabricating a hydrogenated p-type metal oxide layer according to some implementations.

FIG. 5 is a flow diagram illustrating an example of a method of fabricating a hydrogenated p-type metal oxide layer according to some implementations. The process 500 may be performed in different orders and/or with different, fewer or additional operations. In some implementations, the process 500 may be described with reference to one or more processing chambers and a controller, where the controller may be programmed to control any operations described herein.

At block 510 of the process 500, a substrate is provided. The substrate can include any substrate material, including a substantially transparent material, such as glass or plastic. Substantial transparency as used herein can be defined as transmittance of visible light of about 70% or more, such as about 80% or more, or about 90% or more. Glass substrates (sometimes referred to as glass plates or panels) may be or include a borosilicate glass, a soda lime glass, photoglass, quartz, Pyrex®, or other suitable glass material. A non-glass substrate can be used, such as a polycarbonate, acrylic, polyimide, polyethylene terephthalate (PET), or polyether ether ketone (PEEK) substrate. Other suitable substrate materials can include flexible substrate materials. In some implementations, the substrate can have dimensions of a few microns to hundreds of microns.

At block 520 of the process 500, a p-type metal oxide semiconductor layer is formed over the substrate. Examples of p-type metal oxide semiconductors are given above and include p-type tin (II)-based oxide semiconductors and p-type copper (I)-based oxide semiconductors. The p-type metal oxide semiconductor layer can include a channel region aligned or to be aligned with a gate electrode, where the channel region is between a source region and a drain region of the oxide semiconductor layer. In some implementations, the p-type metal oxide semiconductor layer can be between about 10 nm and about 100 nm thick. Block 520 can involve deposition of the p-type metal oxide layer by any method appropriate for the material being deposited, including physical vapor deposition (PVD) processes, chemical vapor deposition (CVD) processes, and atomic layer deposition (ALD) processes. PVD processes include thermal evaporation deposition, sputter deposition and pulsed laser deposition (PLD) processes. For example, SnO may be deposited by sputtering a SnO target. In some implementations, hydrogenation of the p-type metal oxide semiconductor layer may include performing block 520 in a hydrogen-containing atmosphere and/or using hydrogen-containing precursor chemicals to deposit the p-type metal oxide semiconductor layer. Forming the source and drain regions of the p-type metal oxide semiconductor layer can involve doping these regions of the p-type metal oxide semiconductor layer.

At block 530 of the process 500, the p-type metal oxide semiconductor layer is thermally annealed in a hydrogen atmosphere. For example, the p-type metal oxide layer may be exposed to a $H_2$-containing process gas at temperatures ranging between 200° C. and 400° C. The concentration of the $H_2$ in the process gas may range from 1% to 100%. Pure hydrogen gas can be difficult to handle, so in some implementations, it may be diluted with nitrogen ($N_2$) or other inert gas as appropriate. Temperatures outside the range given above may be appropriate in some implementations. In general, the annealing temperature is high enough that sufficient activation energy for the hydrogen to diffuse into and ionically bond with the p-type metal oxide semiconductor layer is provided. The annealing temperature is below a melting temperature of the p-type oxide semiconductor material and below a temperature at which a significant portion of the layer may convert from a p-type material to an n-type material, a metal, or an insulator. For example, temperatures lower than 200° C. may result insufficient incorporation of hydrogen into the p-type metal oxide layer. Temperatures higher than 400° C. may be used in some implementations depending on the material. For a material like SnO, higher temperatures may result in oxidation of Sn(II) to Sn(IV) for example, which could convert a p-type material Sn(II)-based into an n-type Sn(IV)-based material. The extent of hydrogenation may be controlled by parameters including anneal time, temperature, and $H_2$ concentration.

In some implementations, the process can continue with forming one or more dielectric layers or metal layers on the hydrogenated p-type metal oxide layer. For example, in some implementations, a dielectric oxide layer is formed over the oxide semiconductor layer so that the dielectric oxide layer is contacting the oxide semiconductor layer. The dielectric oxide layer may be one of a passivation layer, a gate dielectric layer, and an etch stop layer, for example. The dielectric oxide layer can include any suitable dielectric oxide material, such as $SiO_2$ or $Al_2O_3$. In some implementations, the dielectric oxide layer can be between about 10 nm and about 1000 nm thick, such as between about 300 nm and about 500 nm thick. The hydrogenated p-type oxide semiconductor layer and the dielectric oxide layer can form part of a TFT.

In some implementations, the process 500 further includes forming a source electrode on the source region of the p-type oxide semiconductor layer and forming a drain electrode on the drain region of the p-type oxide semiconductor layer. To form the source electrode and the drain electrode, the source electrode and the drain electrode may be etched. Thus, the process 500 may further include etching the source electrode and the drain electrode to expose the channel region of the oxide semiconductor layer. In some implementations, forming the dielectric oxide layer occurs before forming the source electrode and the drain electrode. This can include instances where the dielectric oxide layer is an etch stop layer or a gate dielectric. In some implementations, forming the dielectric oxide layer can occur after forming the source electrode and the drain electrode. This can include instances where the dielectric oxide layer is a passivation layer formed over the source electrode and the drain electrode to protect the TFT.

In some implementations, the process 500 further includes forming a gate electrode over the substrate. In some implementations, the gate electrode may be formed on the substrate, and a gate dielectric may be formed on the gate electrode for a bottom gate TFT. In some implementations, the dielectric oxide layer may serve as the gate dielectric, and the gate electrode may be formed over the gate dielectric for a top gate TFT.

As indicated above, hydrogenation of the p-type oxide semiconductor layer may involve a hydrogen anneal as described with reference to block 530. In some implementations, block 530 may not be performed, if for example, sufficient hydrogenation occurs in block 520 during formation of the p-type metal oxide semiconductor layer. Still further, in some implementations, hydrogenation may occur from hydrogen diffusion from one or both of an underlying layer and overlying layer into the channel. For example, hydrogen in a dielectric layer that overlies or underlies may diffuse into the channel. Examples of such dielectric layers include $SiO_2$ and $SiN_x$ layers that have 4% to 20% of hydrogen in the form Si—H, O—H or N—H bonds. These bonds can be broken by thermal annealing. In such implementations, the p-type oxide semiconductor layer may be annealed such that the hydrogen diffuses into and ionically bonds to the p-type oxide semiconductor layer.

It should be noted that some amount of hydrogen may be present in the p-type metal oxide semiconductor layer prior to hydrogenation due to the presence of hydrogen in typical ambient conditions. However, the amount of hydrogen in a hydrogenated p-type metal oxide semiconductor layer is higher than the amount that may occur from diffusion from ambient conditions. As indicated above, the amount of hydrogen in the film may range from $10^{18}$ atoms/$cm^3$ to $10^{21}$ atoms/cm or from 0.01% to 10%. By contrast, the concentration of hydrogen in an oxide semiconductor layer would typically be less than this range.

As described above, the hydrogenated p-type metal oxide semiconductor materials disclosed herein provide significantly improved TFT characteristics when employed as channel materials in a TFT. Examples of these characteristics are discussed further below with respect to FIG. 6 and Table 1.

Figure 6:
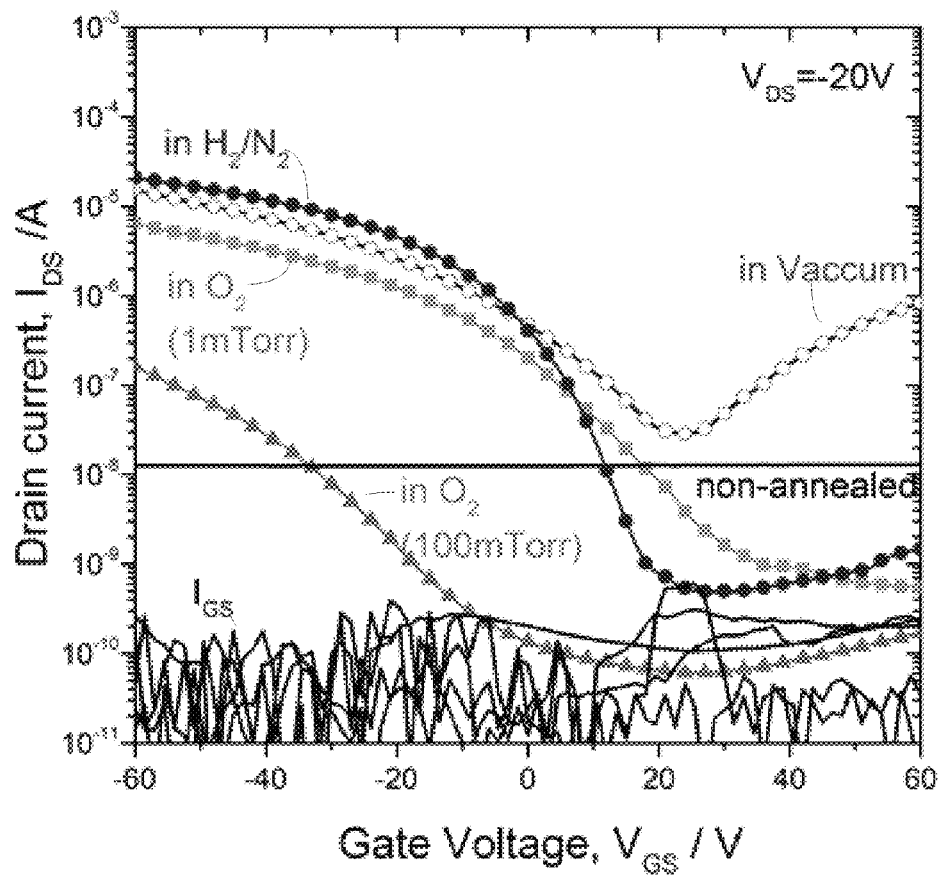
FIG. 6 is an example of a graph showing $I_{DS}$-$V_{GS}$ curves for an unannealed TFT having a p-type tin (II) oxidxe (SnO) channel and TFTs having p-type SnO channels annealed in vacuum, hydrogen, or oxygen atmospheres.

To generate the results shown in FIG. 6 and Table 1, bottom gate TFT device structures such as that illustrated in FIG. 4A were formed. Heavily doped n-type Si (100) and 150 nm thick thermal oxidized $SiO_2$ were used as the gate electrode and the gate insulator, respectively. SnO channels of approximately 15 nm thickness were grown on the $SiO_2$/Si at room temperature by pulsed laser deposition with a KrF excimer laser (l=248 nm, 20 ns). A sintered body of pure SnO was used as a target. The oxygen partial pressure ($PO_2$) and laser density were fixed to be 10 mTorr and 3.0 J/$cm^2$, respectively, during the deposition. After the film growth of SnO, the films were subjected to post-deposition thermal annealing at 250° C. using a rapid thermal annealing system. Hydrogen annealing was performed using forming gas (4% $H_2$ in $N_2$-base, 1 atm). For comparison, SnO channels were also annealed in vacuum (approximately $5 \times 10^{-2}$ mTorr) and oxygen ($PO_2$=1 mTorr and $PO_2$=100 mTorr) atmospheres. Tungsten contacts were used for source/drain electrodes.

FIG. 6 is an example of a graph showing $I_{DS}$ (saturated drain current)-$V_{Gs}$ (saturated gate voltage) curves for an unannealed TFT having a p-type SnO channel and TFTs having p-type SnO channels annealed in vacuum, hydrogen, or oxygen atmospheres. As shown in FIG. 6, the unannealed device did not show any field effect current modulation. This could be due to high density defects around the Fermi level. However, all of the annealed TFTs showed p-channel TFT actions, though the device characteristics vary strongly for the different annealing atmospheres. Table 1, below, includes the saturation mobilities, threshold voltages, s-values, and on/off current ratios as measured for each of the annealed TFTs in one implementation.

TABLE 1

TFT performances (mobility, threshold voltage, s-value, and on-off current ratio) for annealed SnO channel TFTs

| TFT | μ ($cm^2$/Vs) | $V_{th}$ (V) | s-value (V/decade) | on/off current ratio |
|---|---|---|---|---|
| Vacuum annealed | 0.9 | 6 | 14.3 | >6 × $10^2$ |
| $PO_2$ (1 m Torr)-annealed | 0.6 | 4 | 12.5 | >2 × $10^4$ |
| $PO_2$ (100 mTorr)-annealed | 0.004 | −25.5 | 25 | >4 × $10^3$ |
| Hydrogen annealed | 1.6 | 4.5 | 5.2 | >5 × $10^4$ |

The vacuum-annealed device exhibits clear ambioplar behaver, i.e., both n- and p-channel operations. Ab-initio calculations suggest that oxygen vacancy creates electron donor states in SnO. The ambioplar characteristics are believed to originate from the formation of oxygen vacancy defects by vacuum annealing, which work as electron donors in SnO, and which result in having to avoid electron transport to attain a high current on/off ratio. To obtain a low-off current, the oxygen vacancy defects can be reduced. The off-current characteristics were improved by oxygen-containing annealing: the off-current is well suppressed for the two oxygen annealed TFTs and a relatively large on/off ratio of greater than $10^3$ was obtained. Saturation mobility and s-value of about 0.7 $cm^2$/Vs and about 15 V/decade, respectively, were obtained when for a TFT annealed at $PO_2$=1 mTorr. However, high $PO_2$ conditions (e.g., 100 mTorr) lead to the degradation of TFT characteristics. Hydrogen-containing annealing provides further improvement of TFT characteristics. The hydrogen-annealed TFT exhibited a high on/off ratio greater than 5×10$^4$ and a relatively high mobility of greater than 1.6 cm$^2$/Vs, which is comparable with the Hall mobility obtained by the Hall-effect measurement. A s-value of 5V/decade, which corresponds to an interface trap density ($D_{it}$) of about 1.2×10$^{13}$ cm$^{-2}$ev$^{-1}$. The low defect density implies that vacancy defects are effectively reduced by the hydrogen-containing annealing.

Hydrogen forward scattering measurements revealed that the hydrogen atomic percentage for the unannealed and hydrogen annealed channels was 0.1% atomic and 1.7% atomic, respectively. These results indicate that the hydrogen terminates vacancy defects in SnO, leading to the improved TFT characteristics.

Figure 7A:
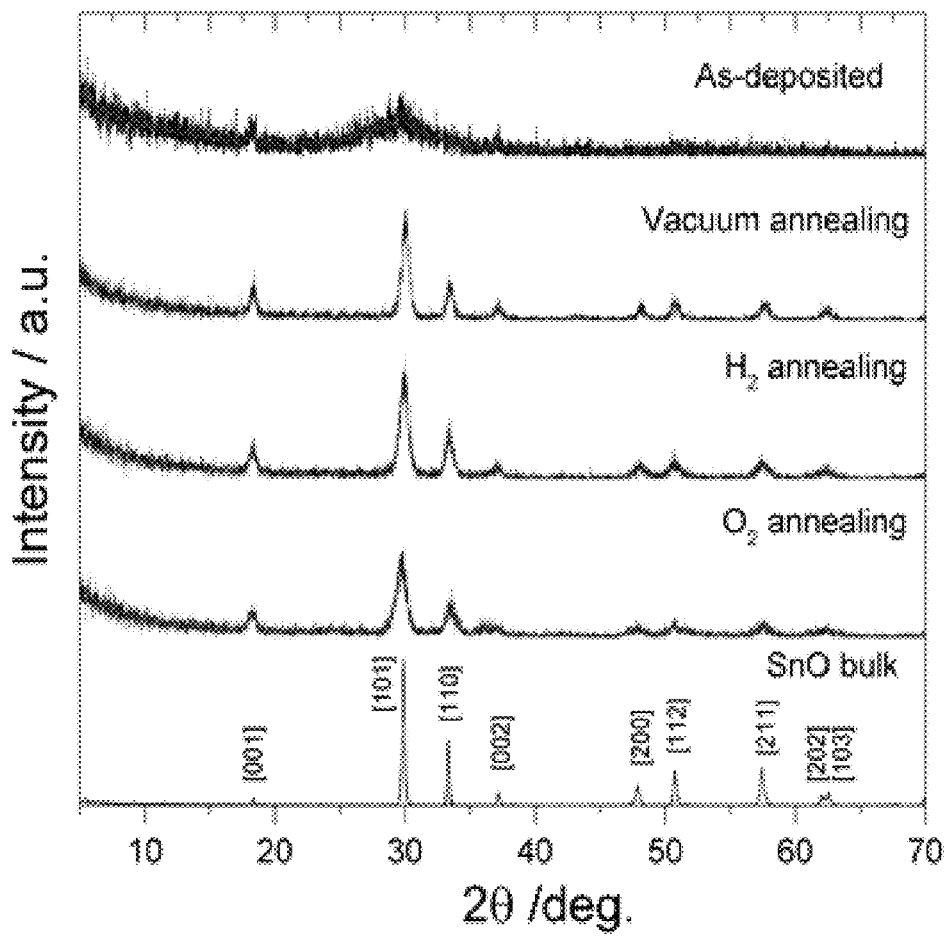
FIG. 7A shows grazing incidence X-ray diffraction (GIXRD) patterns for as-deposited films and films annealed in several atmospheres at 250° C.

SnO films were deposited by pulsed laser deposition with KrF excimer laser (l=248 nm) under controlled oxygen atmosphere at room temperature. The as-deposited films were amorphous or a mixed structure including both amorphous and poly-crystalline SnO with PbO-type structure (typical crystalline volume fraction is <20%). The film densities, d, were measured by grazing incidence X-ray diffraction (GIXRD) and were about 5.5-5.7 g/cm$^3$, which is over 12% less than the theoretical density (6.39 g/cm$^3$). This suggests that the as-deposited state involves high density structural defects. The defect density is roughly estimated from the optical absorption spectrum analysis and found to be about 10$^{20}$ cm$^{-3}$. Post-thermal annealing at 250° C. resulted in the improvement of crystallinity, film density and the reduction of the subgap defects. FIG. 7A shows the GIXRD patterns for the films annealed in vacuum, oxygen (PO$_2$=1 mTorr), and hydrogen (H$_2$=5%) atmospheres. All of the films were crystallized and were non-oriented SnO with film density of 6.4 g/cm$^3$. No Sn$^{4+}$ compounds, i.e., SnO$_2$, were observed from XRD and x-ray photoelectron spectroscopy (XPS) measurements.

Figure 7B:
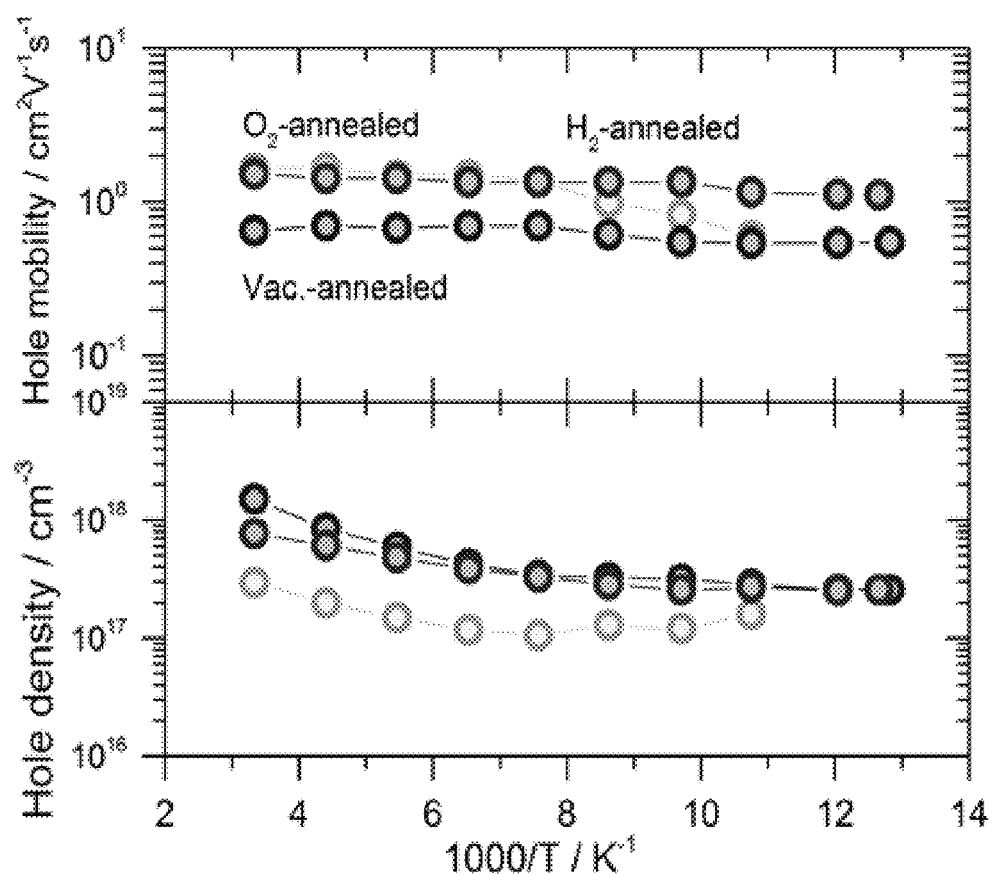
FIG. 7B shows temperature dependences of hole mobility and hole density for films annealed in several atmospheres at 250° C.

FIG. 7B shows temperature dependence of hole mobility and hole density for the annealed SnO films. The hole density shows a thermally activated behavior with activation energy of about 37 meV, suggesting that the acceptor level is located at about 0.1 eV above the valence band maximum (VBM). The average Hall mobilities at room temperature are 0.8-1.9 cm$^2$/Vs. The as-deposited films shows Hall voltage sign anomaly and the electrical conductivity, σ, follows the σ=σ$_0$ exp [-A/T$^{1/4}$] relationship, suggesting that the conduction mechanism is variable-range-hopping with high density localized states near the VBM.

Figure 8A:
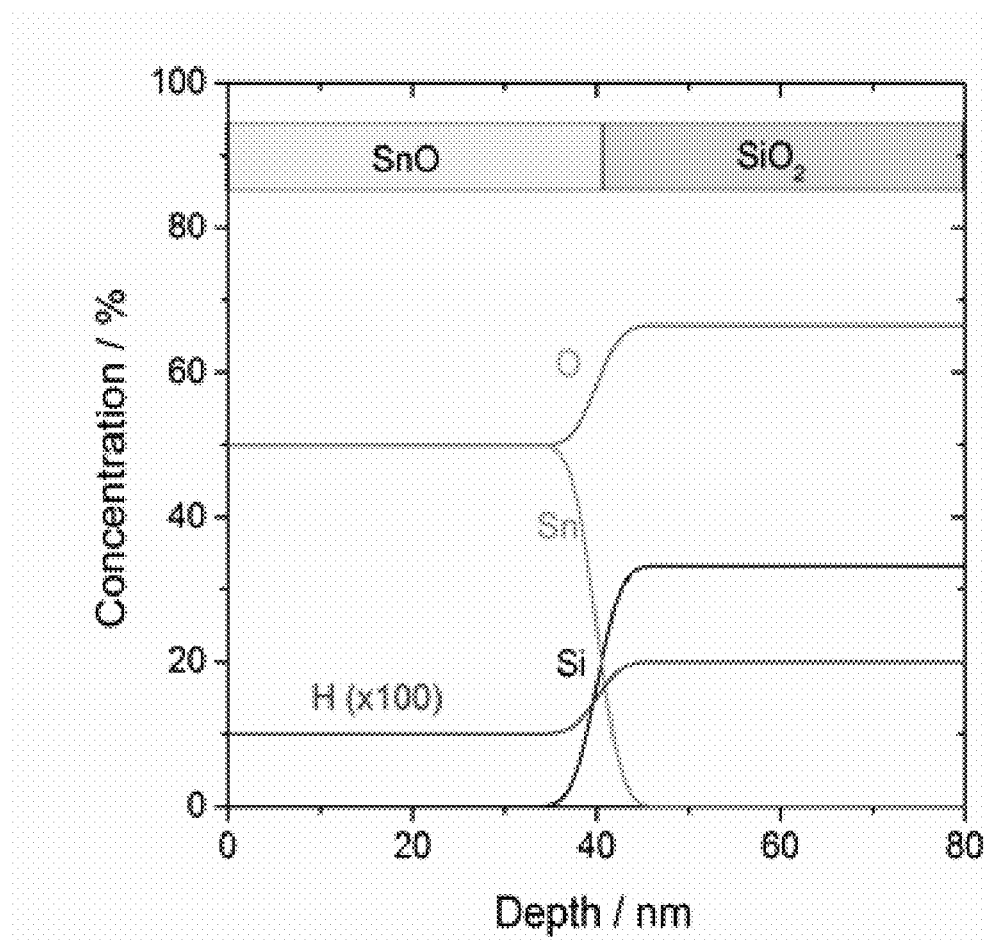
FIGS. 8A and 8B show the chemical composition depth profiles of hydrogen for as-deposited and hydrogen annealed films obtained by RBS/HFS measurements.
Figure 8B:
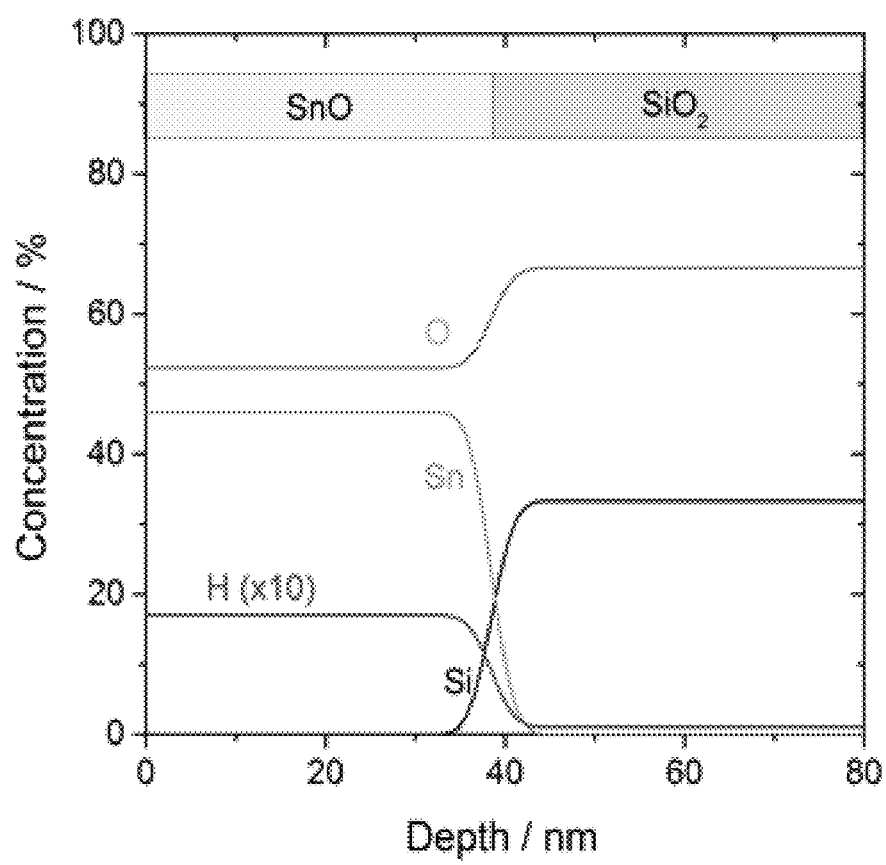

FIGS. 8A and 8B show the chemical composition depth profiles of hydrogen for as-deposited (FIG. 8A) and hydrogen annealed (FIG. 8B) films obtained by RBS/HFS measurements. While the as-deposited films contain relatively high density of hydrogen of about 5×10$^{19}$/cm$^3$ (0.1 at %), which homogeneously distributes, the hydrogen concentration increased to about 8.5×10$^{20}$/cm$^3$ (1.7 at %) after hydrogen annealing at 250° C. This suggests that hydrogen diffuses into the films and effectively terminates the defect state, leading to the improvement of the TFT characteristics.

Figure 9A:
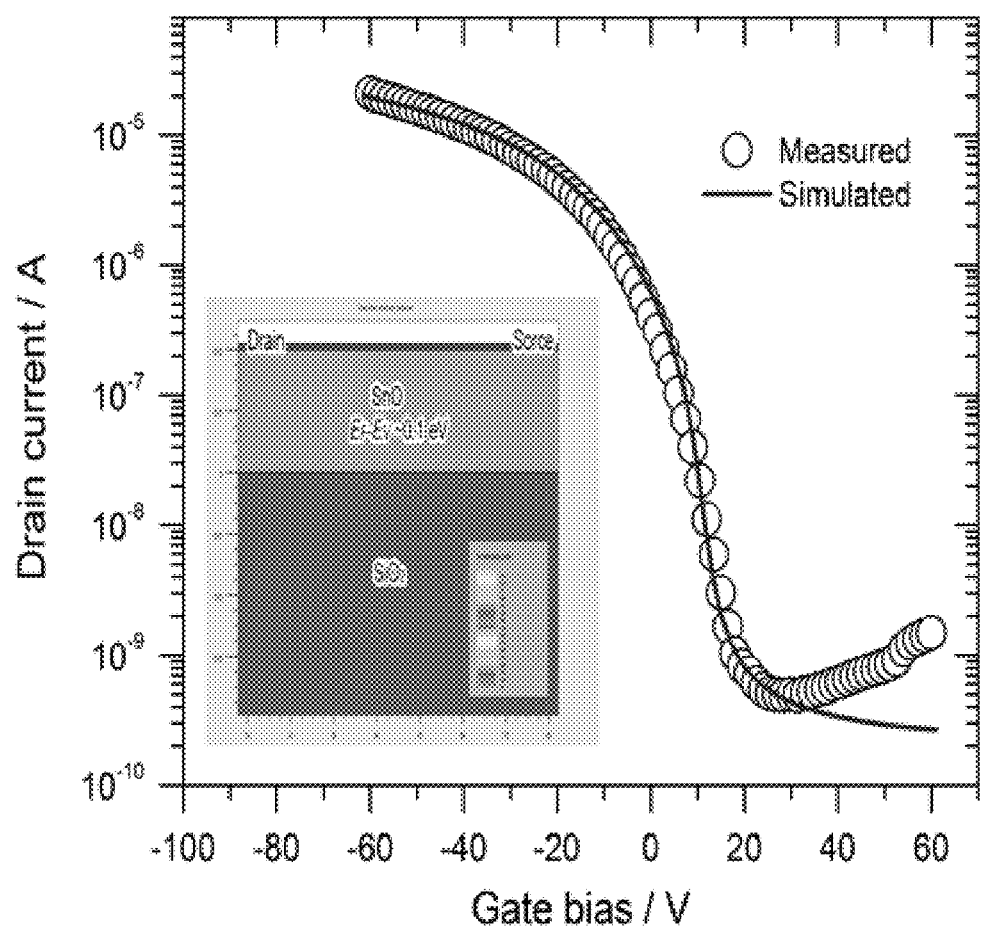
FIG. 9A shows the measured and simulated transfer characteristics for hydrogen annealed TFTs.
Figure 9B:
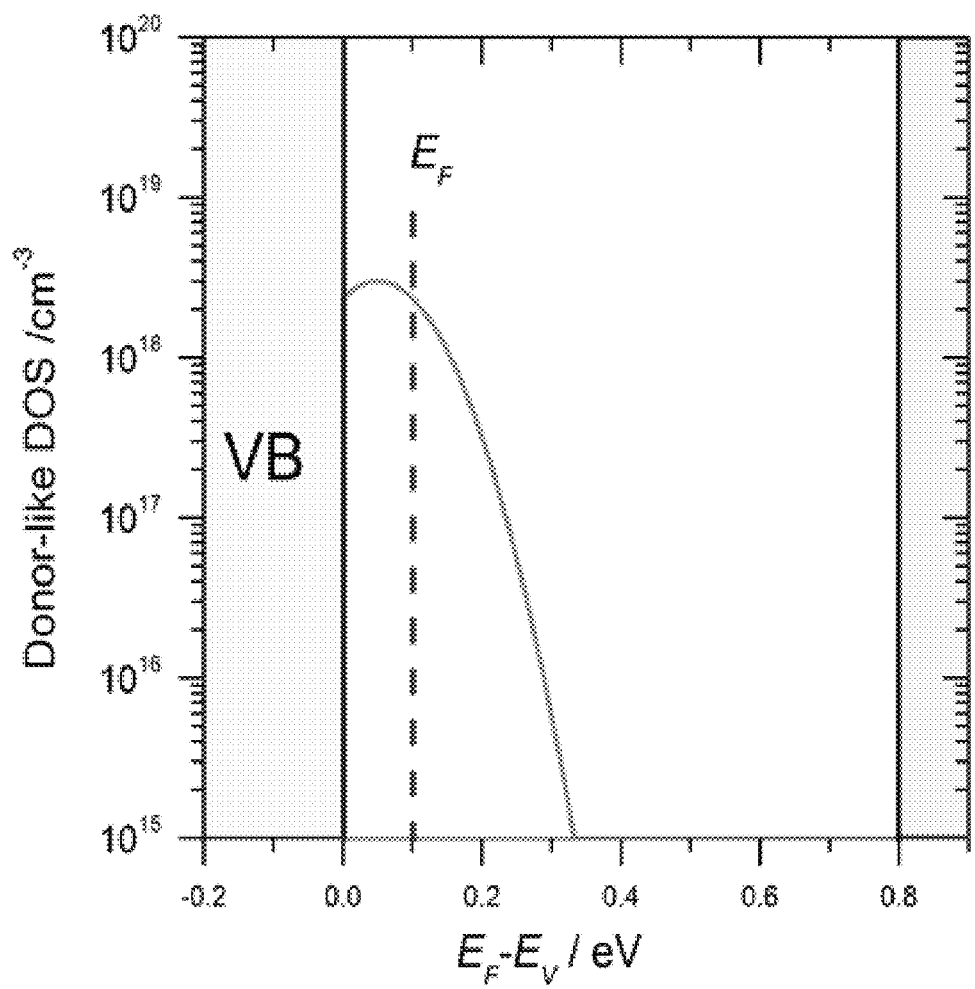
FIG. 9B shows the corresponding extracted subgap density of states (DOS) for the SnO channel.

The SnO channel was also characterized by TFT simulation. FIG. 9A shows the measured and simulated transfer characteristics for hydrogen annealed TFTs. FIG. 9B shows the corresponding extracted subgap density of states (DOS) for the SnO channel. A simple model using donor-like Gaussian DOS, g(E)=$N_{GA}$·exp[-(E$_0$-E/W$_{GA}$)$^2$], where $N_{GA}$ is the density at the central energy, E$_0$ of the Gaussian distribution, and WGA is the characteristic decay energy, reproduced the transfer characteristics. It was found that the defect was located just above the VBM and the density was about 5×10$^{18}$/cm$^3$.

Figure 10A:
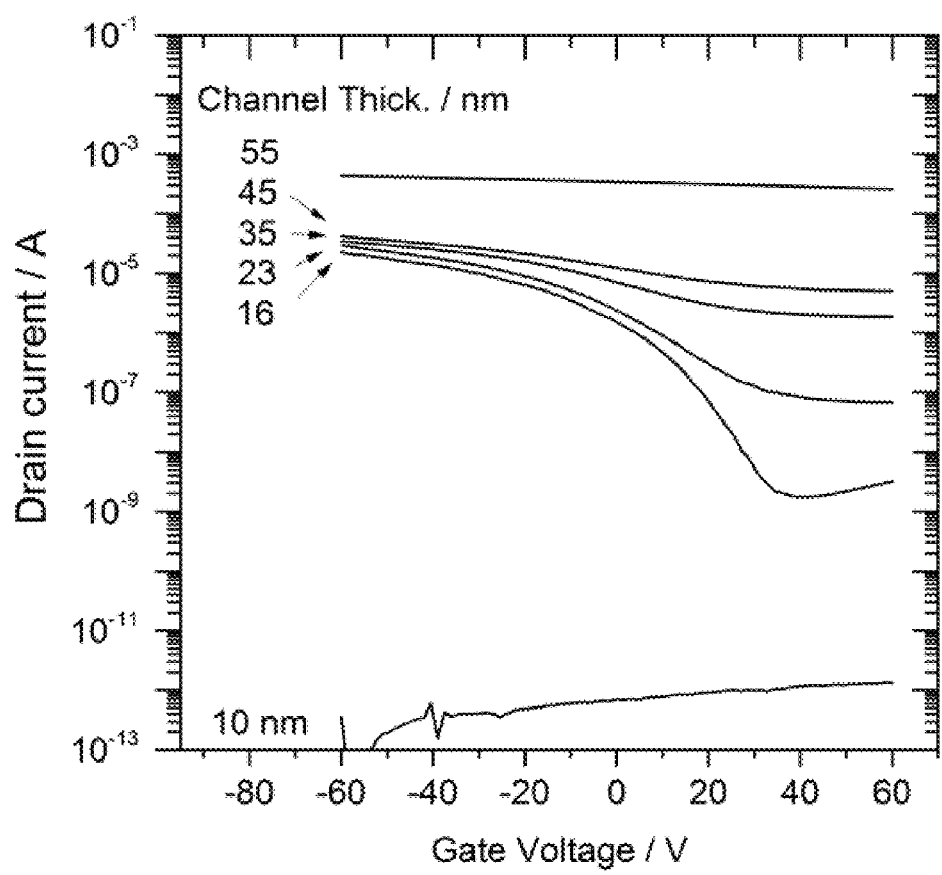
FIG. 10A shows the variation of the TFT characteristics for hydrogen annealed SnO channels with a thickness of 10-55 nm.
Figure 10B:
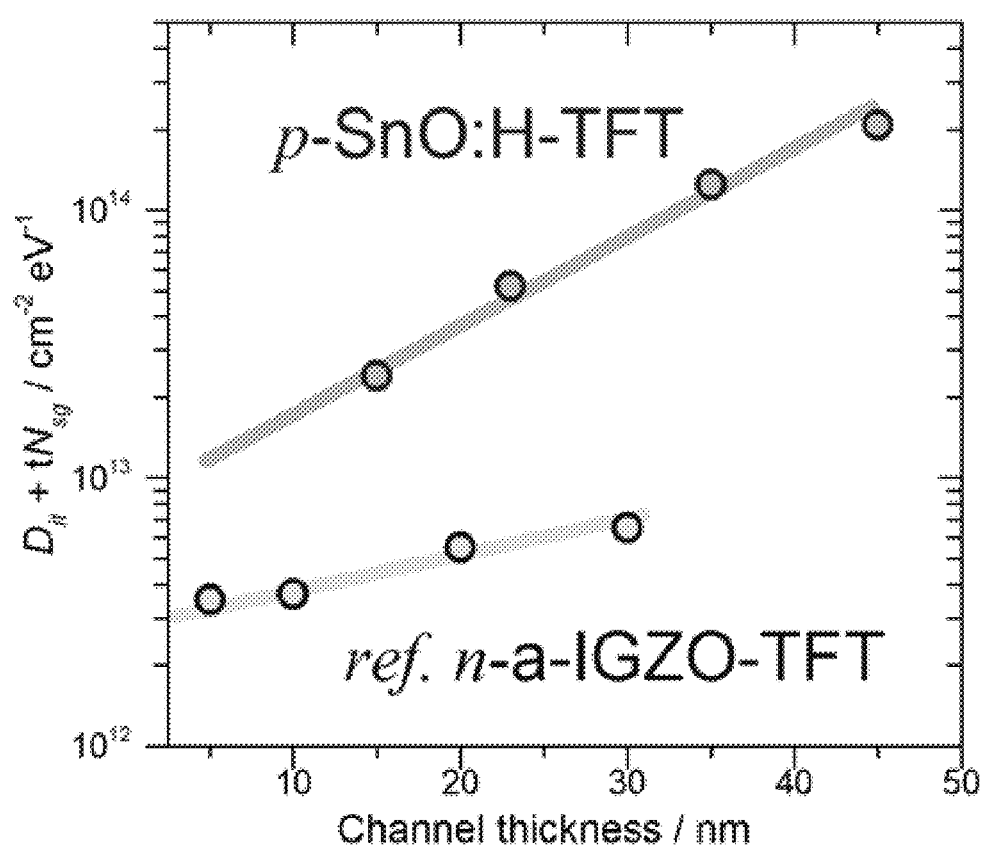
FIG. 10B shows a linear fitting to the Dit+tNsg vs thickness relationship for a hydrogen annealed SnO channel TFT and a reference IGZO TFT.

FIG. 10A shows the variation of the TFT characteristics for hydrogen annealed SnO channels with a thickness of 10-55 nm. The on-currents for channel thicknesses of less than t=45 nm are almost the same, while the off-currents are varied by the channel thickness. This indicates that the TFTs operate in depletion mode and the off-current is controlled by the width of depletion layer from semiconductor-insulator interface. By decreasing the channel thickness, the off-current is decreased and an off current of 1 nA was obtained for the thinnest channel of 16 nm. FIG. 10B shows a linear fitting to the D$_{it}$+tN$_{sg}$ vs thickness relationship for a hydrogen annealed SnO channel TFT and a reference IGZO TFT. The D$_{it}$ and bulk trap density (N$_{sg}$) were estimated using the relationship the following relationship: subthreshold slope=log$_e$ k$_b$T/e[1+e(D$_{it}$+tN$_{sg}$)/C$_{ox}$], where e is the elementary electric charge, k$_b$ the Boltzmann constant, T the temperature, t the channel thickness, and C$_{ox}$ the gate capacitance. It was found that D$_{it}$ is approximately equal to 10$^{13}$/cm$^2$ eV and N$_{sg}$ is equal to about 4×10$^{18}$/cm$^3$ eV, which is consistent with the TFT simulation analysis. The bulk defect density was reduced by two orders compared to that previously reported for SnO channels (D$_{it}$ of about 10$^{14}$/cm$^2$ eV and N$_{sg}$~1.5×10$^{20}$/cm$^3$ eV) though higher than high quality a-IGZO channel (D$_{it}$ of about 10$^{11}$/cm$^2$ eV and N$_{sg}$ of about 3.2×10$^{16}$/cm$^3$ eV).

No current modulations were observed for thinnest channel with less than 10 nm. AFM measurements confirmed that the film is continuous with atomically smooth surface (RMS roughness <0.3 nm). Without being bound by a particular theory, it is believed that surface defects have an important role with oxide material surfaces generally being defective.

A SnO defect study was performed to clarify the origin of hole trap defects and the effect of hydrogen annealing for SnO-TFTs. A first-principle calculation based on density functional theory with Gradient Generalized Approximation PBE (GGA-PBE) was performed by using the Vienna Ab-initio Simulation Package (VASP). A 108-atom supercell (3×3×3 unit cells) was used for the defect calculations. The plane-wave cutoff energy and Monkhorst-Pack special k points were 400 eV and were set to 2×2×2, respectively.

The formation energies (E$_f$) of defects is determined by the following equation:

$$E_f[\text{defect}^q] = E_{tot}[\text{defect}^q] - E_{tot}[\text{perfect}] + \Sigma n_i \mu_i + q(\varepsilon_F + E_{VBM}) \quad \text{Eq. 1}$$

where E$_{tot}$[perfect] and Etot [defect$^q$] are the total energy of supercell containing the defects in a charged state q, n$_i$ and µ$_i$ are the number removed from or to added to reservoir and the chemical potential of atoms, i, respectively, ε$_F$ is the Fermi energy measured from the VBM and E$_{VBM}$ is the eigenvalue of the VBM. The chemical potentials should be varied between the Sn-rich (O-poor) and O-rich (Sn-poor) limits. These limits are given by stability condition of SnO:

$$\Delta H_f[\text{SnO}] = \mu_{SnO} = \mu_{Sn} + \mu_O, \mu_{SnO} = E_{tot}[\text{SnO}]/n_{SnO} \quad \text{Eq. 2}$$

Therefore, the Sn-rich limit refers to a metal boundary (i.e., α-Sn) and is defined by $$\mu_O = \mu_{SnO} - \mu_{\alpha-Sn}, \mu_{Sn} = \mu_{\alpha-Sn} \quad \text{Eq. 3}$$

The O-rich limit is given by the equilibrium condition between SnO and SnO$_2$ and is defined by:

$$\mu_O = \mu_{SnO_2} - \mu_{SnO}, \mu_{Sn} = 2\mu_{SnO} - \mu_{SnO_2}, \quad \text{Eq. 4}$$

The defect transition (ionization) energy level ε (q/q') is determined by $$\varepsilon(q/q')=\Delta E_f(q)-\Delta E_f(q')/q-q' \qquad \text{Eq. 5}$$

Figure 11:
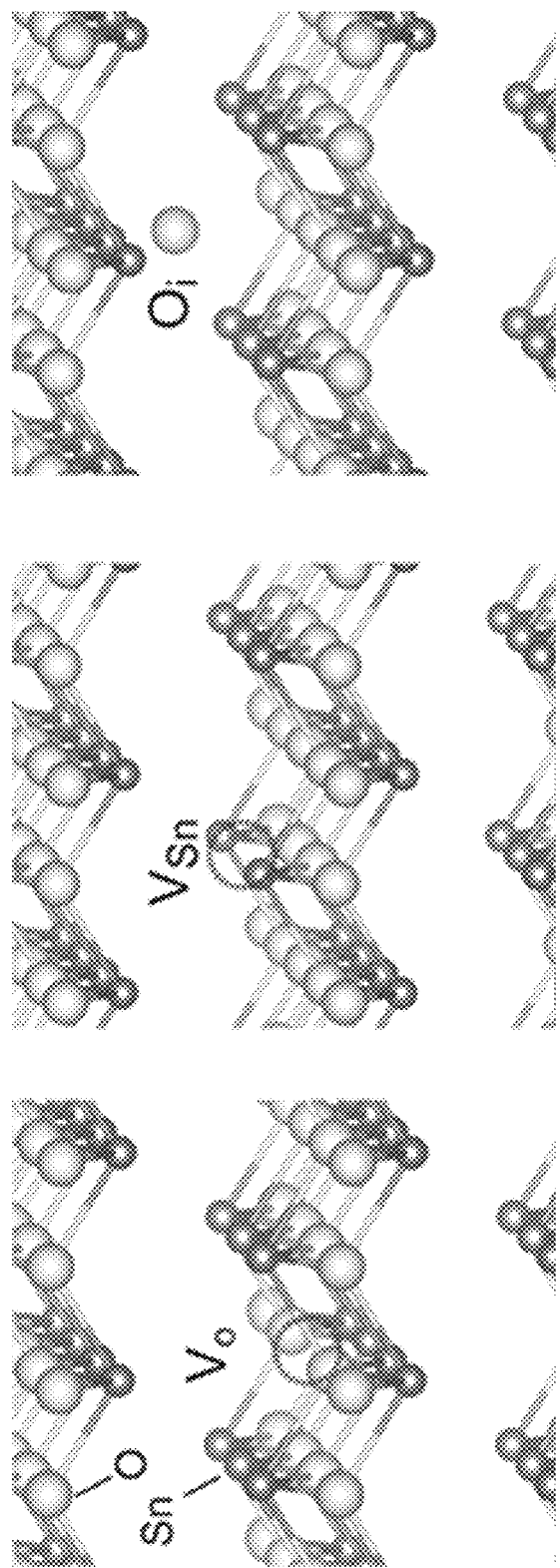
FIG. 11 shows the local atomic structure of the following energetically favorable native defects in SnO: oxygen vacancy defects ($V_O$), tin vacancy defects ($V_{Sn}$) and oxygen interstitial defects ($O_i$).
Figure 12:
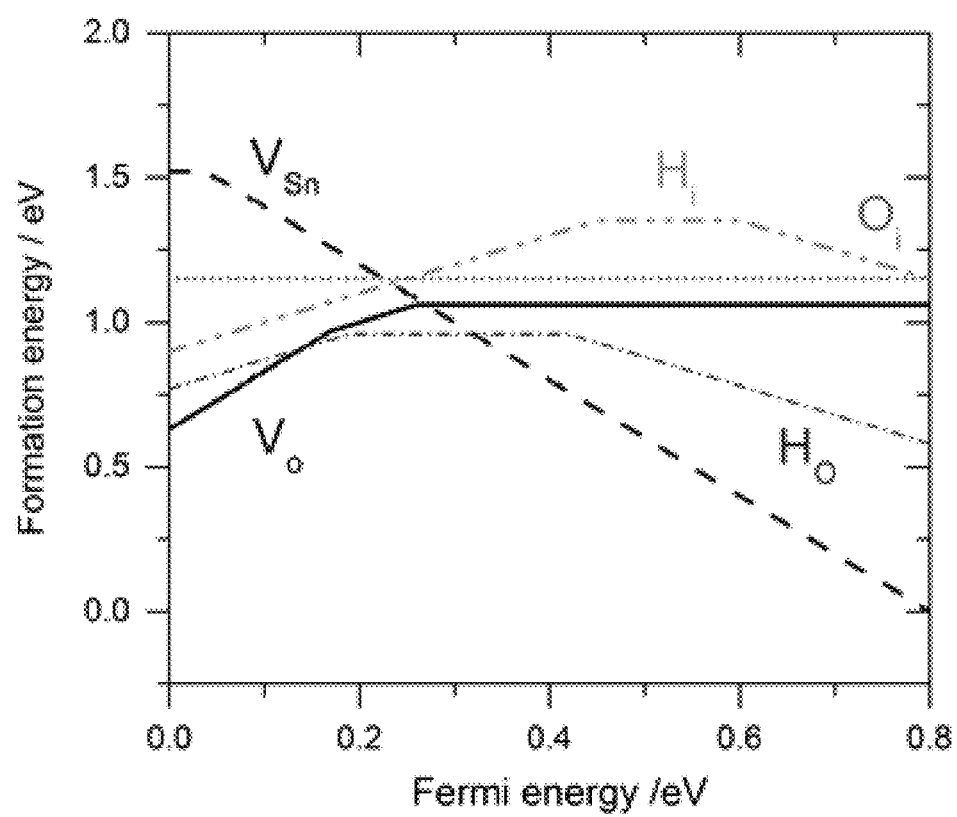
FIG. 12 shows the formation energies of native defects as a function of Fermi level under the Sn-rich limit.

FIG. 11 shows the local atomic structure of the following energetically favorable native defects in SnO: oxygen vacancy defects ($V_O$), tin vacancy defects ($V_{Sn}$) and oxygen interstitial defects ($O_i$). FIG. 12 shows the formation energies of native defects as a function of Fermi level under the Sn-rich limit. Oxygen interstitials have no defect transition levels in the bandgap and thereby are electrically inactive. Tin vacancies show the defect transition levels $\varepsilon(0/-)$ of about 0.03 eV and $\varepsilon(-/2-)$ of about 0.05 eV above the VBM, suggesting that they form a double shallow acceptor state. The value is close to the acceptor level obtained from the electrical measurement (about 100 meV) and thereby $V_{Sn}$ is possibly a source of p-type conduction in SnO. On the other hand, the oxygen vacancies show defect transition levels of about 0.2 eV for $\varepsilon(0/2+)$ above the VBM, indicating that $V_O$ forms a double deep donor state. However, as the energy level is too deep for an electron donor, it does not work as an electron donor but plays an important role as a hole trap state. The existence of deep donor defects is consistent with the result obtained from the TFT simulation study for SnO-TFTs. This suggests that the origin of hole traps is oxygen vacancy defects and that eliminating the defects improves the electrical propriety of SnO-TFTs.

FIG. 12 also shows the formation energies of hydrogen impurities including hydrogen interstitials ($H_i$) and complexes with $V_O$ ($H_O$). From the formation energy, hydrogen impurities are energetically stable in SnO. For $H_i$, the transition levels $\varepsilon(+/0)$ and $\varepsilon(0/-)$ are about 0.45 and 0.6 eV from the VBM, while the transition levels $\varepsilon(+/0)$ and $\varepsilon(0/-)$ are about 0.2 and 0.43 eV from the VBM for $H_O$. The formation energy of $H_O$ is relatively low and hydrogen is likely to bond to vacancy defects. Therefore, hydrogen atoms terminate $V_O$ defects and reduce the defect density of hole traps. Consequently, hydrogen annealing improves TFT characteristics.

Figure 13:
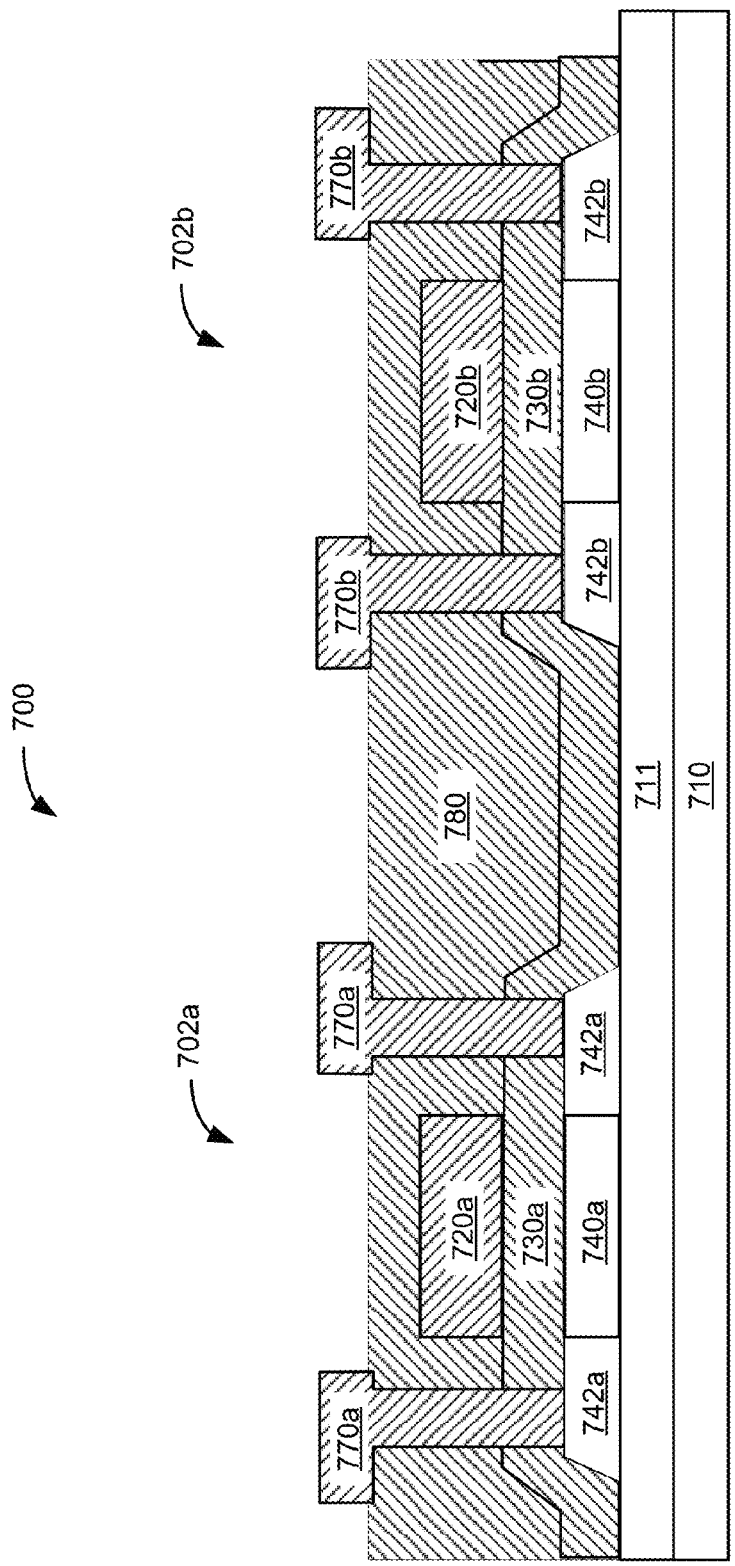
FIG. 13 is an example of a cross-sectional diagram illustrating a complementary metal-oxide-semiconductor (CMOS) TFT device according to some implementations.

In some implementations, the hydrogenated p-type metal oxide semiconductor layer may form part of a CMOS TFT device including a p-type TFT and an n-type TFT. FIG. 13 is an example of a cross-sectional diagram illustrating a CMOS TFT device according to some implementations. In FIG. 13, a CMOS TFT device 700 includes a p-type top gate TFT 702a and an n-type top gate TFT 702b on a substrate 710. Examples of substrates are described above. In the example of FIG. 13, the p-type top gate TFT 702a and the n-type top gate TFT 702b are formed on a dielectric layer 711; in some implementations, however, they may be formed on the substrate 710 as in the example of FIG. 4B.

The p-type top gate TFT 702a includes a hydrogenated p-type metal oxide semiconductor layer including a channel region 740a and source and drain regions 742a. Source and drain electrodes 770a contact the source and drain regions 742a of the hydrogenated p-type metal oxide semiconductor layer, and a gate electrode 720a overlies a gate dielectric 730a. The hydrogenated p-type metal oxide semiconductor layer of the p-type TFT 702a may include any of the hydrogenated p-type metal oxides discussed above.

The n-type top gate TFT 702b includes an n-type metal oxide semiconductor layer including a channel region 740b and source and drain regions 742b. Source and drain electrodes 770b contact the source and drain regions 742b of the n-type metal oxide layer, and a gate electrode 720b overlies a gate dielectric 730b. The source and drain electrodes 770a and 770b may be formed in a dielectric layer 780, which separates the p-type top gate TFT 702a and the n-type top gate TFT 702b.

In some implementations, the n-type metal oxide semiconductor is amorphous and can include indium (In)-containing, zinc (Zn)-containing, tin (Sn)-containing, hafnium (Hf)-containing, and gallium (Ga)-containing oxide semiconductors. Examples of n-type amorphous oxide semiconductors include InGaZnO, InZnO, InHfZnO, InSnZnO, SnZnO, InSnO, GaZnO, and ZnO.

In some implementations, the p-type metal oxide semiconductor and the n-type metal oxide semiconductor may be differently doped films of the same metal oxide. For example, the p-type metal oxide semiconductor may be hydrogenated SnO as described above and the n-type metal oxide semiconductor may be SnO doped with antimony (Sb) to form an n-type metal oxide semiconductor.

In some implementations, the CMOS TFT includes bottom gate TFTs as discussed above with reference to FIG. 4A. A CMOS TFT device, such as shown in the example of FIG. 13, may be used as part of a driving circuit, for example, of a display device.

Figure 14A:
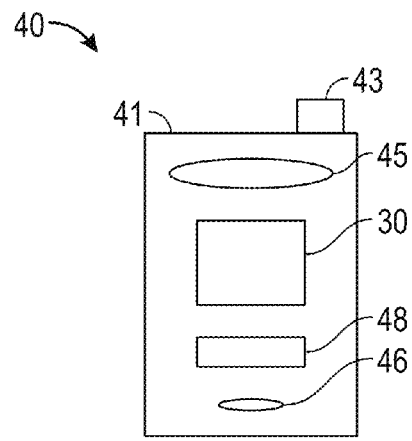
FIGS. 14A and 14B are system block diagrams illustrating a display device that includes a plurality of IMOD display elements.
Figure 14B:
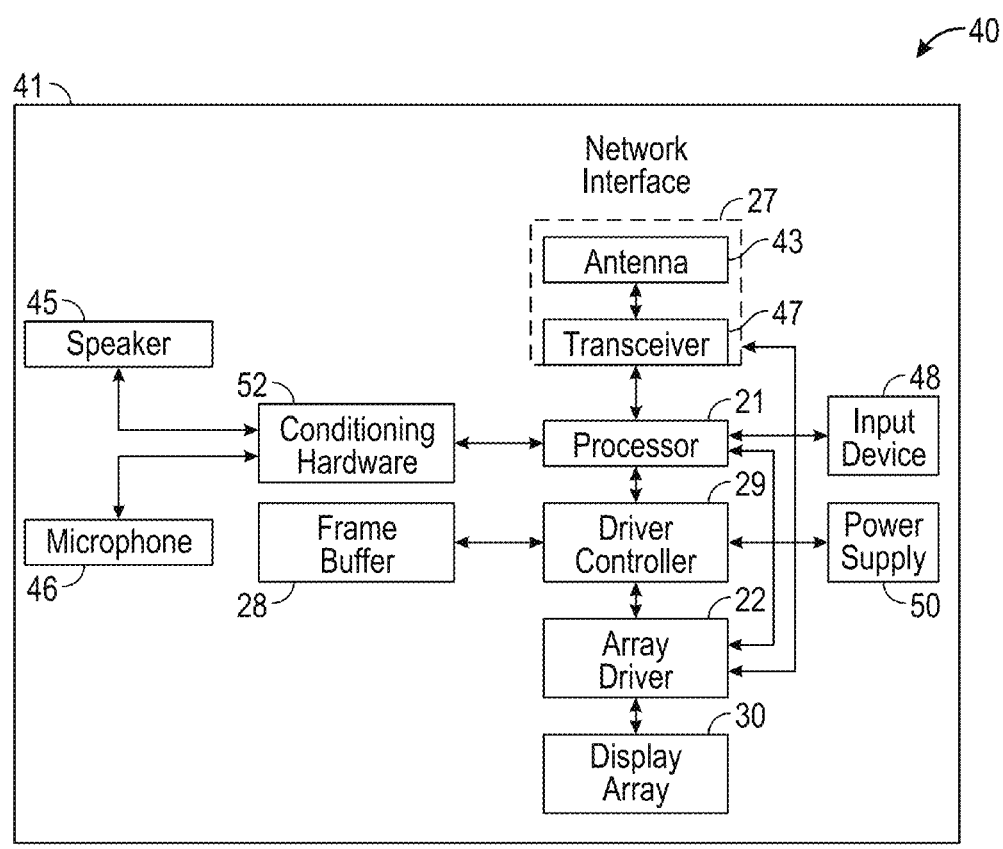

FIGS. 14A and 14B are system block diagrams illustrating a display device 40 that includes a plurality of IMOD display elements and a TFT as described herein. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD-based display, as described herein.

The components of the display device 40 are schematically illustrated in FIG. 14A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 14A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as an IMOD display element controller). Additionally, the array driver 22 can be a conventional driver or a bi-stable display driver (such as an IMOD display element driver). Moreover, the display array 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The steps of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above also may be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A method, comprising:
   providing a substrate;
   forming a p-type metal oxide semiconductor layer on the substrate; and
   annealing the p-type metal oxide semiconductor layer in a hydrogen ($H_2$)-containing atmosphere to form a hydrogenated p-type metal oxide semiconductor layer, wherein annealing the p-type metal oxide semiconductor layer in a hydrogen ($H_2$)-containing atmosphere terminates metal cation vacancies ($V_M$) and wherein the hydrogenated p-type metal oxide semiconductor layer has a hydrogen concentration of at least $10^{18}$ atoms/cm$^3$.

2. The method of claim 1, wherein the p-type metal oxide semiconductor layer is a Sn (II)-based oxide semiconductor layer.

3. The method of claim 1, wherein the p-type metal oxide semiconductor layer is a Cu (I)-based oxide semiconductor layer.

4. The method of claim 1, wherein the p-type metal oxide semiconductor of the p-type metal oxide semiconductor layer is one of a compound in a group consisting of doped or undoped $Cu_2O$, $CuO$, $SnO$, $NiO$, $PbO$, $Ag_2O$, $Mn_3O_4$, $ZnRh_2O_4$, $SrCu_2O_2$, $CuWO_4$, and Ln—Ru—O compounds where Ln is any lanthanide except cerium (Ce).

5. The method of claim 1, wherein the p-type metal oxide semiconductor of the p-type metal oxide semiconductor layer is selected from p-type copper delafossites of the formula $CuMO_2$, where M is a metal.

6. The method of claim 1, wherein the p-type metal oxide semiconductor of the p-type metal oxide semiconductor layer is an $ABO_2$ oxide characterized by a delafossite crystal structure.

7. The method of claim 1, wherein forming the hydrogenated p-type metal oxide semiconductor layer includes depositing the p-type metal oxide semiconductor layer in a hydrogen ($H_2$)-containing atmosphere.

8. The method of claim 1, further comprising forming a gate electrode and a gate dielectric, wherein the gate dielectric is between the p-type metal oxide semiconductor layer and the gate electrode.

9. The method of claim 1, wherein the hydrogenated p-type metal oxide semiconductor layer has a hydrogen concentration of at least $10^{19}$ atoms/cm$^3$.

10. The method of claim 1, wherein the hydrogenated p-type metal oxide semiconductor layer has a hydrogen concentration of at least $10^{20}$ atoms/cm$^3$.

11. The method of claim 1, wherein the hydrogenated p-type metal oxide semiconductor layer has a hydrogen concentration of at least $10^{21}$ atoms/cm$^3$.

12. The method of claim 5, wherein M is a Group IIIA or IIIB metal.

13. The method of claim 1, wherein annealing the p-type metal oxide semiconductor layer in a hydrogen ($H_2$)-containing atmosphere terminates dangling bond defects in the p-type metal oxide semiconductor layer.

14. The method of claim 2, wherein annealing the p-type metal oxide semiconductor layer in a hydrogen ($H_2$)-containing atmosphere terminates tin vacancies ($V_{Sn}$) and oxygen vacancies ($V_O$).

15. The method of claim 1, further comprising breaking hydrogen bonds in a dielectric layer that overlies or underlies the p-type metal oxide semiconductor layer to allow hydrogen in the dielectric layer to diffuse into the p-type metal oxide semiconductor layer.

16. The method of claim 1, wherein annealing the p-type metal oxide semiconductor layer in a hydrogen ($H_2$)-containing atmosphere terminates oxygen vacancies ($V_O$).

17. The method of claim 1, wherein most of the hydrogen incorporated into the p-type metal oxide semiconductor layer during the annealing terminates the metal cation vacancies ($V_M$).

* * * * *